(12) United States Patent
Kim et al.

(10) Patent No.: US 12,499,818 B2
(45) Date of Patent: Dec. 16, 2025

(54) DISPLAY DEVICE, METHOD OF MANUFACTURING DISPLAY DEVICE, AND DRIVING METHOD OF DISPLAY DEVICE

(71) Applicant: Samsung Display Co., LTD., Yongin-si (KR)

(72) Inventors: Hyo Jung Kim, Yongin-si (KR); Seung Bo Shim, Yongin-si (KR); Min Ji Baek, Yongin-si (KR); Hye Sun Sung, Yongin-si (KR); Ji Hyeon Son, Yongin-si (KR); Jeong Yong Lee, Yongin-si (KR)

(73) Assignee: Samsung Display Co., LTD., Yongin-si (KR)

( * ) Notice: Subject to any disclaimer, the term of this patent is extended or adjusted under 35 U.S.C. 154(b) by 69 days.

(21) Appl. No.: 18/493,124

(22) Filed: Oct. 24, 2023

(65) Prior Publication Data
US 2024/0331615 A1 Oct. 3, 2024

(30) Foreign Application Priority Data
Apr. 3, 2023 (KR) .......................... 10-2023-0043718

(51) Int. Cl.
*G09G 3/32* (2016.01)
*H01L 25/075* (2006.01)
*H01L 25/16* (2023.01)
*H10D 86/40* (2025.01)
*H10D 86/60* (2025.01)
*H10H 20/831* (2025.01)
(Continued)

(52) U.S. Cl.
CPC .......... *G09G 3/32* (2013.01); *H01L 25/0753* (2013.01); *H01L 25/167* (2013.01); *H10D 86/431* (2025.01); *H10D 86/60* (2025.01); *H10H 20/8312* (2025.01); *H10H 20/857* (2025.01); *G09G 2320/0247* (2013.01); *G09G 2320/0257* (2013.01); *H10H 20/032* (2025.01)

(58) Field of Classification Search
CPC ............. G09G 3/32; G09G 2320/0247; G09G 2320/0257; H10H 20/8312; H10H 20/857; H10H 20/032; H10D 86/431; H10D 86/60; H01L 25/0753; H01L 25/167
See application file for complete search history.

(56) References Cited

U.S. PATENT DOCUMENTS 11,183,541 B2 11/2021 Hack et al.
11,195,862 B2 12/2021 Jang et al.
(Continued)

FOREIGN PATENT DOCUMENTS

CN 114744014 7/2022
KR 1997-0007287 5/1997
(Continued)

*Primary Examiner* — Peter D McLoone
(74) *Attorney, Agent, or Firm* — Innovation Counsel LLP

(57) ABSTRACT

A display device includes a first layer disposed on a base layer and including a first gate electrode, a first gate insulating layer, and an active layer, and a second layer disposed on the first layer and including a second gate electrode, a second gate insulating layer, and the active layer. The first layer and the second layer share the active layer. The first gate insulating layer has a first dielectric constant, and the second gate insulating layer has a second dielectric constant. The first dielectric constant and the second dielectric constant are different from each other.

20 Claims, 13 Drawing Sheets

(51) Int. Cl.
    *H10H 20/857*     (2025.01)
    *H10H 20/01*     (2025.01)

(56)               References Cited

U.S. PATENT DOCUMENTS

2019/0206969 A1*   7/2019   Hwang ................ G09G 3/3225
2021/0257393 A1*   8/2021   Yuan ................. H10D 30/6734
2021/0280652 A1*   9/2021   Kim .................. H10D 30/0314
2022/0181420 A1    6/2022   Kim et al.
2022/0328591 A1   10/2022   Sun
2024/0030247 A1*   1/2024   Lu ......................... H01L 25/167

FOREIGN PATENT DOCUMENTS

| KR | 10-2018-0135981 | 12/2018 |
|---|---|---|
| KR | 10-2020-0079900 | 7/2020 |
| KR | 10-2317062 | 10/2021 |
| KR | 10-2022-0081435 | 6/2022 |
| WO | 2018/017325 | 1/2018 |

\* cited by examiner

DISPLAY DEVICE, METHOD OF MANUFACTURING DISPLAY DEVICE, AND DRIVING METHOD OF DISPLAY DEVICE

CROSS REFERENCE TO RELATED APPLICATION(S)

This application claims priority to and benefits of Korean Patent Application No. 10-2023-0043718 under 35 U.S.C. § 119, filed on Apr. 3, 2023, in the Korean Intellectual Property Office (KIPO), the entire contents of which are incorporated herein by reference.

BACKGROUND

1. Technical Field

The disclosure relates to a display device, a method of manufacturing a display device, and a driving method of a display device.

2. Description of the Related Art

Display devices are widely used in various fields, and demands for display devices having high resolution have recently increased.

In general, a display device includes a panel for displaying an image, and a data driver and a scan driver, which drive the panel. The data driver and the scan driver respectively output a data signal and a scan signal.

Each pixel of the display device may receive a data signal and a scan signal during a scan on-time (or a gate on-time). In a display device having high resolution, as the scan on-time of a pixel is shortened, a risk that a scan delay margin will not be sufficiently secured increases. The scan delay margin may include a porch period of a horizontal (e.g., a row direction of the pixel) synchronization signal of the display device. In case that the scan delay margin is not sufficiently secured, there exists a probability that a risk associated with a driving signal occurs, such as that horizontal synchronization for some pixels is not appropriately performed.

Accordingly, in a high-resolution display device, a structure and a method of the display device for reducing a risk associated with a driving signal are required.

SUMMARY

The disclosure provides a display device, a method of manufacturing a display device, and a driving method of a display device, which can improve the reliability of a driving signal and improve display quality.

According to an embodiment, a display device may include a first layer disposed on a base layer and including a first gate electrode, a first gate insulating layer, and an active layer and a second layer disposed on the first layer and including a second gate electrode, a second gate insulating layer, and the active layer. The first layer and the second layer may share the active layer. The first gate insulating layer may have a first dielectric constant, and the second gate insulating layer may have a second dielectric constant. The first dielectric constant and the second dielectric constant may be different from each other.

According to an embodiment, one of the first dielectric constant and the second dielectric constant may be equal to or greater than about 7, and another one of the first dielectric constant and the second dielectric constant may be less than about 7.

According to an embodiment, the first gate insulating layer and the second gate insulating layer may include different materials from each other. One of the first gate insulating layer and the second gate insulating layer may include at least one of zirconium oxide ($Zr_xO_y$), hafnium oxide ($Hf_xO_y$), yttrium oxide ($Y_xO_y$), strontium oxide ($Sr_xO_y$), lanthanum oxide ($La_2O_3$), barium oxide ($Ba_xO_y$), tantalum oxide ($Ta_xO_y$), and titanium oxide ($Ti_xO_y$). Another one of the first gate insulating layer and the second gate insulating layer may include at least one of silicon oxide ($SiO_x$), silicon nitride ($SiN_x$), and silicon oxynitride ($SiO_xN_y$).

According to an embodiment, the display device may further include an electrode including a first electrode and a second electrode and disposed on the second gate insulating layer. The electrode may be electrically connected to the active layer by penetrating the second gate insulating layer.

According to an embodiment, the display device may further include an auxiliary electrode layer disposed on the base layer and a contact part penetrating the first gate insulating layer. The auxiliary electrode layer may be electrically connected to the active layer through the contact part.

According to an embodiment, the first gate insulating layer may have a first thickness in a thickness direction of the base layer, and the second gate insulating layer may have a second thickness in the thickness direction. The first thickness and the second thickness may be the same.

According to an embodiment, the first gate insulating layer may have a first thickness in a thickness direction of the base layer, and the second gate insulating layer may have a second thickness in the thickness direction. The first thickness and the second thickness may be different from each other.

According to an embodiment, the first dielectric constant may be equal to or greater than about 7. The first thickness may be less than the second thickness.

According to an embodiment, the second dielectric constant may be equal to or greater than about 7. The second thickness may be less than the first thickness.

According to an embodiment, the display device may further include a pixel circuit formed on the base layer and including a driving transistor and a switching transistor and a light emitting element electrically connected to the pixel circuit. The switching transistor may include the active layer, the first gate electrode, and the second gate electrode. The switching transistor may be operated in one of a first driving mode and a second driving mode, in the first driving mode, the switching transistor is operated by supplying a first gate signal to the first gate electrode, and in the second driving mode, the switching transistor is operated by supplying a second gate signal to the second gate electrode.

According to an embodiment, the first dielectric constant may be greater than the second dielectric constant. The switching transistor may be operated in the first driving mode in case that one of the first gate signal and the second gate signal having a first driving frequency equal to or greater than a predetermined frequency is applied to the switching transistor. The switching transistor may be operated in the second driving mode in case that another one of the first gate signal and the second gate signal having a second driving frequency less than the predetermined frequency is applied to the switching transistor.

According to an embodiment, the first dielectric constant may be less than the second dielectric constant. The switching transistor may be operated in the first driving mode in case that one of the first gate signal and the second gate signal having a first driving frequency less than a predetermined frequency is applied to the switching transistor. The switching transistor may be operated in the second driving mode in case that another one of the first gate signal and the second gate signal having a second driving frequency equal to or greater than the predetermined frequency is applied to the switching transistor.

According to an embodiment, in case that the switching transistor may be operated in the first driving mode, the first gate signal may be applied to the first gate electrode, and the second gate signal may not be applied to the second gate electrode.

According to an embodiment, the predetermined frequency may be about 60 Hz.

According to an embodiment, a method of manufacturing a display device, the method may include forming a first gate electrode and a first gate insulating layer on a base layer, forming an active layer on the first gate insulating layer, and forming a second gate insulating layer and a second gate electrode on the active layer. The first gate insulating layer may have a first dielectric constant, and the second gate insulating layer may have a second dielectric constant. One of the first dielectric constant and the second dielectric constant may be equal to or greater than about 7, and another one of the first dielectric constant and the second dielectric constant may be less than about 7.

According to an embodiment, the method may further include forming a first electrode and a second electrode on the second gate insulating layer. The first electrode and the second electrode may be electrically connected to the active layer by penetrating the second gate insulating layer.

According to an embodiment, the method may further include forming an auxiliary electrode layer on the base layer; and forming a first electrode and a second electrode penetrating the first gate insulating layer. The first electrode and the second electrode may be electrically connected to the active layer by penetrating the first gate insulating layer. The forming of the first electrode and the second electrode may include performing a heat treatment process.

According to an embodiment, a method of driving a display device, the display device may include a driving transistor and a switching transistor on a base layer. The switching transistor may include a first layer disposed on the base layer and including a first gate electrode, a first gate insulating layer, and an active layer and a second layer disposed on the first layer and including a second gate electrode, a second gate insulating layer, and the active layer. The first layer and the second layer may share the active layer. The first gate insulating layer may have a first dielectric constant, and the second gate insulating layer may have a second dielectric constant. The first dielectric constant and the second dielectric constant may be different from each other. in the method may include a first driving mode and a second driving mode, in the first driving mode, the switching transistor is operated based on a first gate signal supplied to the first gate electrode, and in the second driving mode, the switching transistor is operated based on a second gate signal supplied to the second gate electrode.

According to an embodiment, the first dielectric constant may be greater than the second dielectric constant. In the first driving mode, the switching transistor may be operated in case that one of the first gate signal and the second gate signal having a first driving frequency equal to or greater than a predetermined frequency is applied to the switching transistor. In the second driving mode, the switching transistor may be operated in case that another one of the first gate signal and the second gate signal having a second driving frequency less than the predetermined frequency is applied to the switching transistor.

According to an embodiment, the first dielectric constant may be less than the second dielectric constant. In the first driving mode, the switching transistor may be operated in case that one of the first gate signal and the second gate signal having a first driving frequency less than a predetermined frequency is applied to the switching transistor. In the second driving mode, the switching transistor may be operated in case that another one of the first gate signal and the second gate signal having a second driving frequency equal to or greater than the predetermined frequency is applied to the switching transistor.

DETAILED DESCRIPTION OF THE EMBODIMENTS

Figure 1:
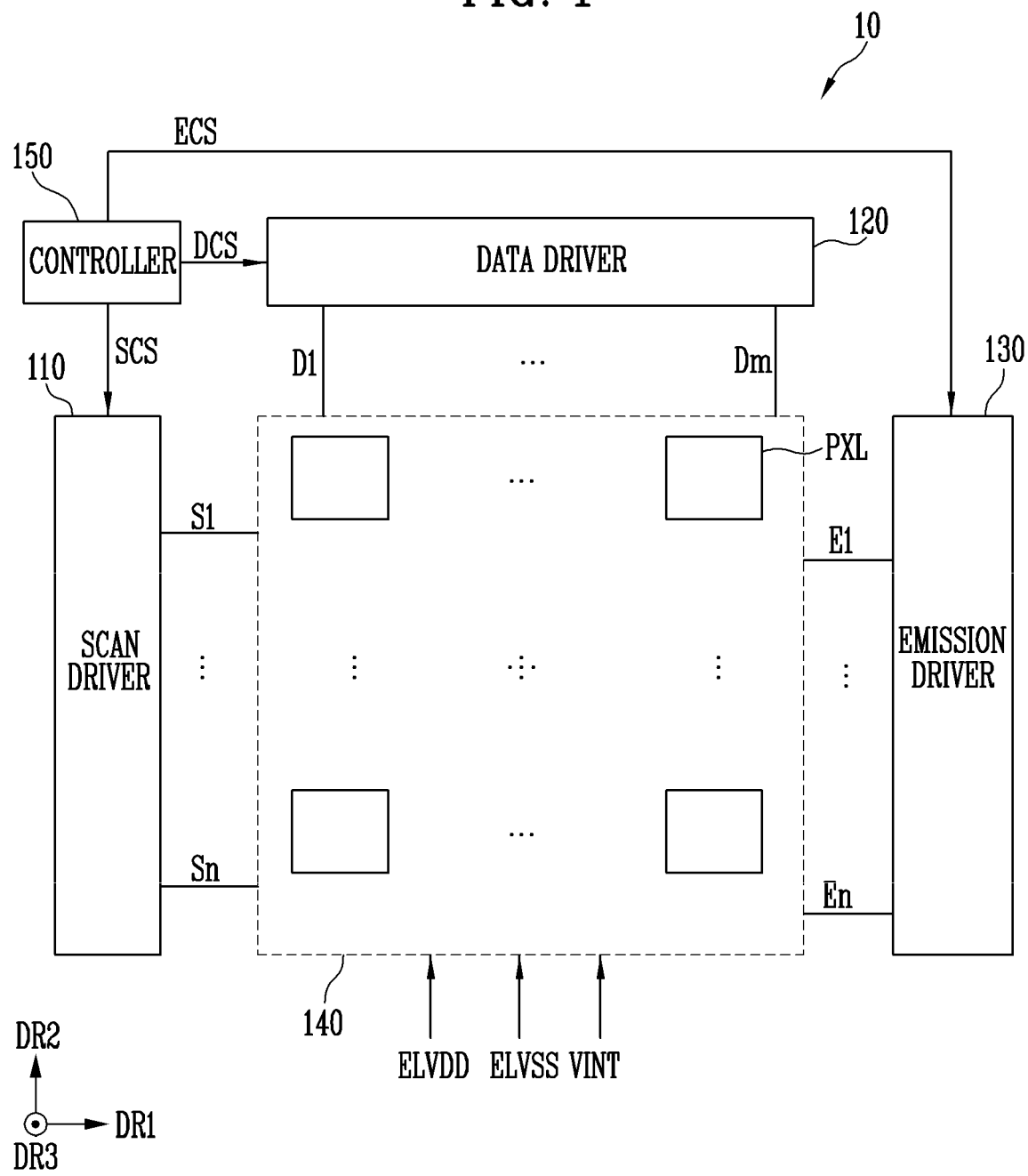
FIG. 1 is a schematic block diagram illustrating a display device in accordance with an embodiment of the disclosure.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

The disclosure may apply various changes and different shape, therefore only illustrate in details with particular examples. However, the examples do not limit to certain shapes but apply to all the change and equivalent material and replacement.

Unless otherwise specified, the illustrated embodiments are to be understood as providing example features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

The display surface may be parallel to a surface defined by a first direction DR1 and a second direction DR2. A normal direction of the display surface, i.e., a thickness direction of the display device 10, may indicate a third direction DR3. In this specification, an expression of "when viewed from the top or in a plan view" may represent a case when viewed in the third direction DR3. Hereinafter, a front surface (or a top surface) and a rear surface (or a bottom surface) of each of layers or units may be distinguished by the third direction DR3. However, directions indicated by the first to third directions DR1, DR2, and DR3 may be a relative concept, and converted with respect to each other, e.g., converted into opposite directions.

The terminology used herein is for the purpose of describing particular embodiments and is not intended to be limiting. It will be understood that, although the terms "first," "second," etc. may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms, "a," "an," and "the" are intended to include the plural forms as well, unless the context clearly indicates otherwise.

It will be further understood that the terms "includes," "comprises," "has," "including," "comprising," and/or "having," when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, when an element is referred to as being "directly on" another element, no intervening elements are present. Further, an expression that an element such as a layer, region, substrate or plate is placed "beneath" or "below" another element indicates not only a case where the element is placed "directly beneath" or "just below" the other element but also a case where a further element is interposed between the element and the other element. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

When an element, such as a layer, film, region, or substrate is referred to as being "on," "connected to," or "coupled to" another element, it may be directly on, connected to, or coupled to the other element or intervening elements may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the first direction DR1, the second direction DR2, and the third direction DR3 are not limited to three axes of a rectangular coordinate system, such as the x, y, and z axes, and may be interpreted in a broader sense. For example, the first direction DR1, the second direction DR2, and the third direction DR3 may be perpendicular to one another, or may represent different directions that are not perpendicular to one another.

For the purposes of this disclosure, the phrase "at least one of A and B" may be construed as A only, B only, or any combination of A and B. "At least one of X, Y, and Z," "at least two of X, Y, and Z," and "at least one selected from the group consisting of X, Y, and Z" may be construed as X only, Y only, Z only, or any combination of two or more of X, Y, and Z. Also, "at least two of X, Y, and Z," may be construed as two or more of X, Y, and Z such as both X and Y, both X and Z, both Y and Z, both X, Y, and Z.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

When a component is described herein to "connect" another component to the other component or to be "connected to" other components, the components may be connected to each other as separate elements, or the components may be integral with each other.

Throughout the specification, when an element is referred to as being "connected" to another element, the element may be "directly connected" to another element, or "electrically connected" to another element with one or more intervening elements interposed therebetween. Also, when an element is referred to as being "in contact" or "contacted" or the like to another element, the element may be in "electrical contact" or in "physical contact" with another element; or in "indirect contact" or in "direct contact" with another element.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

The disclosure relates to a display device, a method of manufacturing a display device, and a driving method of a display device. Hereinafter, a display device, a method of manufacturing a display device, and a driving method of a display device in accordance with an embodiment of the disclosure will be described with reference to the accompanying drawings.

FIG. 1 is a schematic block diagram illustrating a display device in accordance with an embodiment of the disclosure.

Referring to FIG. 1, the display device 10 may emit light. The display device 10 may include a scan driver 110, a data driver 120, and emission driver 130, a pixel unit 140, and a controller 150. The pixel unit 140 may include pixels PXL. The display device 10 may further include a first power source ELVDD, a second power source ELVSS, a third power source VINT, scan lines S1 to Sn, emission control lines E1 to En, and data lines D1 to Dm.

The pixels PXL may be electrically connected to the scan lines S1 to Sn, the emission control lines E1 to En, and the data lines D1 to Dm. Also, the pixels PXL may be electrically connected to the first power source ELVDD, the second power source ELVSS, and the third power source VINT.

For convenience of description, a specific connection relationship between the pixels PXL, and the scan lines S1 to Sn, the emission control lines E1 to En, and the data lines D1 to Dm is omitted in FIG. 1.

The pixels PXL may be supplied with scan signals from the scan lines S1 to Sn, and be supplied with data signals synchronized with the scan signals from the data lines D1 to Dm.

Each of the pixels PXL supplied with the data signals may control an amount of driving current flowing from the first power source ELVDD to the second power source ELVSS via a light emitting element (see, e.g., LD of FIG. 2), and the light emitting element LD may generate light with a luminance corresponding to the amount of driving current.

The light emitting element LD may be provided in various forms. For example, the light emitting element LD may be an inorganic light emitting diode including an inorganic material. According to an embodiment, the light emitting element LD may be an organic light emitting diode. However, the disclosure is not limited thereto. The light emitting element LD may be an inorganic light emitting diode including an inorganic semiconductor, and be a flip chip type micro light emitting diode (LED).

Each of the pixels PXL may be electrically connected to multiple scan lines S1 to Sn. In an embodiment, each of the pixels PXL may be electrically connected to a first scan line corresponding to a pixel row (e.g., a predetermined or selectable pixel row), a second scan line corresponding to another pixel row (e.g., a previous pixel row of the pixel row), and a third scan line corresponding to the other pixel row (e.g., a next pixel row of the pixel row).

For example, pixels PXL disposed on an ith horizontal line may be electrically connected to an ith scan line Si, an (i−1)th scan line Si−1, and an (i+1)th scan line Si+1 (i is a natural number of equal to or greater than 2).

In this specification, a first direction DR1 may be a row direction of the pixel PXL, and may be a horizontal direction in FIG. 1. A second direction DR2 may be a column direction of the pixel PXL, and may be a vertical direction in FIG. 1. A third direction DR3 may be a thickness direction of a base layer (see, e.g., BSL of FIG. 4), a display direction of the display device 10, or a normal direction on which the base layer is disposed in a plan view.

However, the disclosure is not necessarily limited thereto, and a connection relationship between the pixels PXL and the scan lines S1 to Sn may be variously changed according to structures of the pixels PXL.

The scan driver 110 may supply scan signals to the scan lines S1 to Sn, based on a scan driver control signal SCS provided from the controller 150.

For example, the scan driver 110 may sequentially supply scan signals to the scan lines S1 to Sn. In case that the scan signals are sequentially supplied to the scan lines S1 to Sn, the pixels PXL may be sequentially selected in units of horizontal lines. A scan signal may have a voltage level at which a transistor (see, e.g., TR of FIG. 2) supplied with the scan signal can be turned on.

The emission driver 130 may supply emission control signals to the emission control lines E1 to En, based on an emission driver control signal ECS provided from the controller 150.

For example, the emission driver 130 may sequentially supply emission control signal to the emission control lines E1 to En. An emission control signal may have a voltage level at which the transistor supplied with the emission control signal can be turned off.

The data driver 120 may supply data signals to the data lines D1 to Dm, based on a data driver control signal DCS provided from the controller 150.

The data signals supplied to the data lines D1 to Dm may be supplied to pixels PXL selected by each scan signal. To this end, the data driver 120 may supply the data signals to the data lines D1 to Dm in synchronization with the scan signals.

The controller 150 may acquire (or generate) the data driver control signal DCS, the scan driver control signal SCS, and the emission driver control signal ECS, based on control signals supplied to the data driver 120, the scan driver 110, and the emission driver 130.

According to an embodiment, the controller 150 may acquire (or generate) different control signals (e.g., the data driver control signal DCS, the scan driver control signal SCS, and the emission driver control signal ECS) according to an operation mode. For example, the controller 150 may be operated in a first frequency operation mode or a second frequency operation mode.

In the first frequency operation mode, the controller 150 may acquire control signals, and a switching transistor (see, e.g., Ts of FIG. 2) may be operated (or driven) in a first driving mode according to the control signals. In the second frequency operation mode, the controller 150 may acquire control signals, and the switching transistor may be operated in a second driving mode according to the control signals.

In case that the controller 150 is operated in the first frequency operation mode, thereby outputting control signals (e.g., the data driver control signal DCS, the scan driver control signal SCS, and the emission driver control signal ECS) corresponding to the first frequency operation mode, the switching transistor may be operated in the first driving mode. In case that the controller 150 is operated in the second frequency operation mode, thereby outputting control signals (e.g., the data driver control signal DCS, the scan driver control signal SCS, and the emission driver control signal ECS) corresponding to the second frequency operation mode, the switching transistor may be operated in the second driving mode. The driving mode of the switching transistor may be determined by a frequency. The first driving mode and the second driving mode of the switching transistor will be described in detail below.

The scan driver control signal SCS may be supplied to the scan driver 110. The data driver control signal DCS may be supplied to the data driver 120. The emission driver control signal ECS may be supplied to the emission driver 130.

The scan driver control signal SCS may include a scan start signal and clock signals. The scan start signal may control a supply timing of scan signals, and the clock signals may shift the scan start signal.

The emission driver control signal ECS may include an emission start signal and clock signals. The emission start signal may control a supply timing of emission control signals, and the clock signals may shift the emission start signal.

The data driver control signal DCS may include a source start signal, a source output enable signal, a source sampling clock, the like, or a combination thereof. The source start signal may control a data sampling start time of the data driver 120. The source sampling clock may control a sampling operation of the data driver 120 with respect to a rising or falling edge. The source output enable signal may control an output timing of the data driver 120.

Although n scan lines S1 to Sn and n emission control lines E1 to En are illustrated in FIG. 1, the disclosure is not limited thereto. In an embodiment, dummy scan lines and/or dummy emission control lines may be additionally formed so as to achieve a stability of driving.

Also, although the scan driver 110, the data driver 120, the emission driver 130, and the controller 150 are individually illustrated in FIG. 1, the disclosure is not limited thereto, and according to an embodiment, at least some of the components may be integrated.

The scan driver 110, the data driver 120, the emission driver 130, and the controller 150 may be implemented using various methods such as chip on glass, chip on plastic, tape carrier package, chip on film, and the like.

Figure 2:
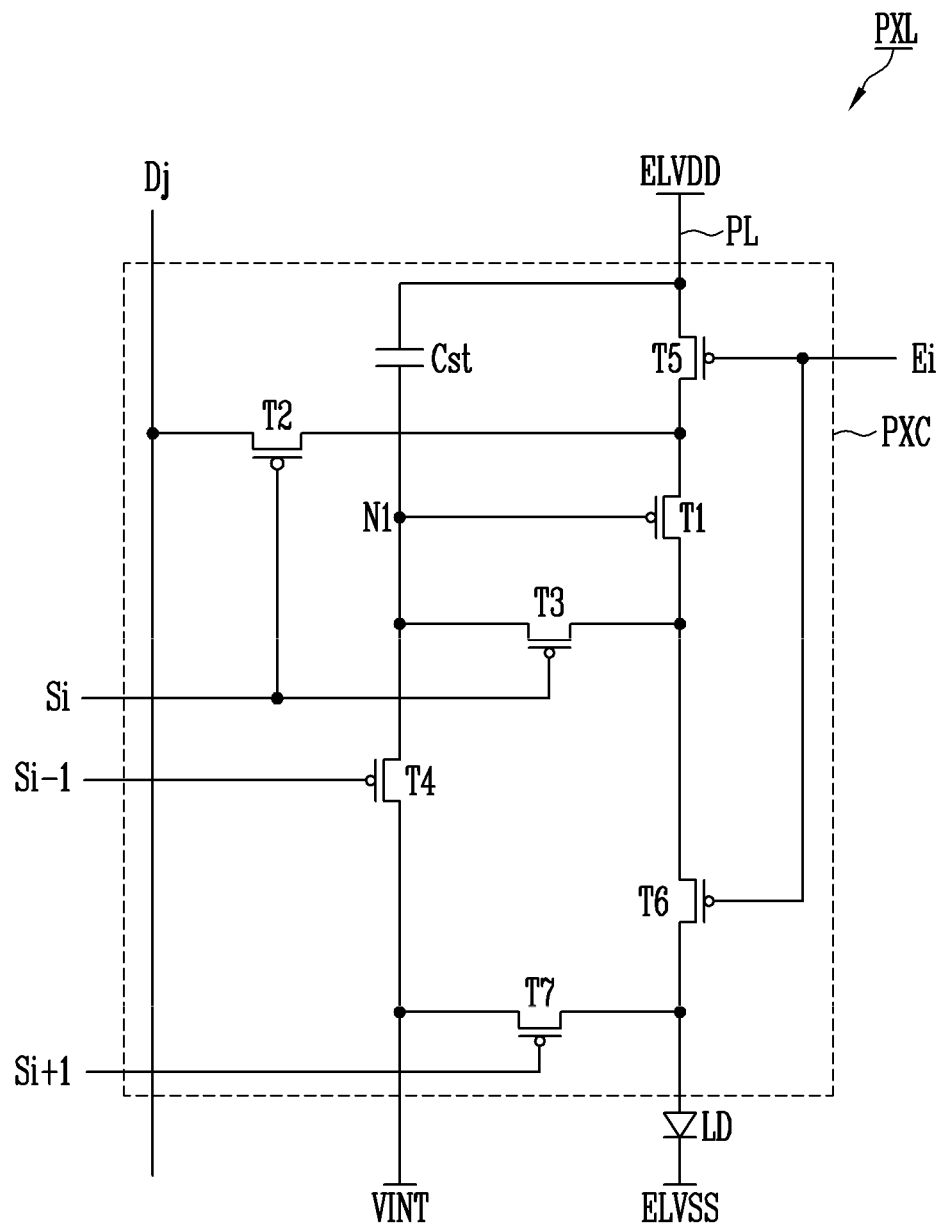
FIG. 2 is a schematic diagram of an equivalent circuit of a pixel circuit included in a pixel in accordance with an embodiment of the disclosure.

FIG. 2 is a schematic diagram of an equivalent circuit of a pixel circuit included in a pixel in accordance with an embodiment of the disclosure.

For convenience, a pixel PXL arranged on an ith (i is a natural number) row and a jth (j is a natural number) column of the pixel unit 140 is illustrated in FIG. 2.

In FIG. 2, an ith scan line Si may supply a scan signal to pixels PXL on an ith row.

Also, in FIG. 2, the other scan lines Si−1 and Si+1 electrically connected to the pixel PXL may be used as initialization control lines for controlling initialization, and be used as current scan lines in pixels PXL on adjacent rows (e.g., pixels PXL on an (i−1)th row and an (i+1)th row). Hereinafter, for convenience, a current scan line on the (i−1)th row is described as an "(i−1)th scan line Si−1," a current scan line on the ith row is described as an "ith scan line Si," a current scan line on the (i+1)th row is described as an "(i+1)th scan line Si+1," an emission control line on the ith row is described as an "emission control line Ei," a data line on the jth column is described as a "data line Dj," and a power line on the jth column (e.g., a power line on the jth column), to which the first power source ELVDD is applied is described as a "power line PL."

Referring to FIG. 2, the pixel PXL in accordance with an embodiment of the disclosure may include a light emitting element LD and a pixel circuit PXC. The pixel circuit PXC may include transistors TR and a storage capacitor Cst. The pixel circuit PXC may be formed on a base layer (see, e.g., BSL of FIGS. 4 and 5).

Hereinafter, for convenience of description, an embodiment in which the pixel circuit PXC for driving the pixel PXL includes seven transistors T1 to T7 and one storage capacitor Cst will be described. However, the disclosure is not limited thereto, and the number of circuit elements and the like may be changed.

According to an embodiment, the transistors TR may include a first transistor T1 (e.g., a driving transistor) and a switching transistor Ts. The switching transistor Ts may include second to seventh transistors T2 to T7.

An anode electrode of the light emitting element LD may be electrically connected to the first transistor T1 via the sixth transistor T6, and a cathode electrode of the light emitting element LD may be electrically connected to the second power source ELVSS. The light emitting element LD may emit light with a luminance corresponding to an amount of current supplied from the first transistor T1. A voltage value of the first power source ELVDD may be set higher than a voltage value of the second power source ELVSS and a current may flow though the light emitting element LD.

A first electrode of the first transistor T1 (e.g., the driving transistor) may be electrically connected to the first power source ELVDD via the fifth transistor T5, and a second electrode of the first transistor T1 may be electrically connected to the anode electrode of the light emitting element LD via the sixth transistor T6. A gate electrode of the first transistor T1 may be electrically connected to a first node N1. The first transistor T1 may control an amount of current flowing from the first power source ELVDD to the second power source ELVSS via the light emitting element LD.

The switching transistor Ts may include transistors T2 to T7 except the first transistor T1 formed as the driving transistor.

The display device 10 in accordance with the disclosure may be characterized in that the switching transistor Ts is operated in different operation modes. For example, the switching transistor Ts may be operated in the first driving mode, based on a control signal provided in case that the controller 150 is operated in the first frequency operation mode. In another embodiment, the switching transistor Ts may be operated in the second driving mode, based on a control signal provided in case that the controller 150 is operated in the second frequency operation mode.

After a connection structure of each of the transistors T2 to T7 included in the switching transistor Ts is described, structural characteristics associated with the first driving mode and the second driving mode of the switching transistor Ts will be described below.

The second transistor T2 may be electrically connected between a data line Dj and the first electrode of the first transistor T1. A gate electrode of the second transistor T2 may be electrically connected to an ith scan line Si. The second transistor T2 may be turned on and electrically connect the data line Dj and the first electrode of the first transistor T1 to each other in case that a scan signal is supplied to the ith scan line Si.

The third transistor T3 may be electrically connected between the second electrode of the first transistor T1 and the first node N1. A gate electrode of the third transistor T3 may be electrically connected to the ith scan line Si. The third transistor T3 may be turned on and electrically connect the second electrode of the first transistor T1 and the first node N1 to each other in case that the scan signal is supplied to the ith scan line Si. Therefore, in case that the third transistor T3 is turned on, the first transistor T1 may be electrically connected in a diode form.

The fourth transistor T4 may be electrically connected between the first node N1 and the third power source VINT. A gate electrode of the fourth transistor T4 may be electrically connected to an (i−1)th scan line Si−1. The fourth transistor T4 may be turned on and supply a voltage of the third power source VINT to the first node N1 in case that a scan signal is supplied to the (i−1)th scan line Si−1. In an embodiment, the (i−1)th scan line Si−1 may be used as an initialization control line for initializing a gate node of the first transistor T1, i.e., the first node N1. However, the disclosure is not limited thereto. For example, in another embodiment, another control line such as an (i−2)th scan line Si−2 or the like may be used as the initialization control line for initializing the gate node of the first transistor T1.

The fifth transistor T5 may be electrically connected between the first power source ELVDD and the first transistor T1. A gate electrode of the fifth transistor T5 may be electrically connected to an emission control line Ei. The fifth transistor T5 may be turned off in case that an emission control signal is supplied to the emission control line Ei, and be turned on in case that the emission control signal is not supplied to the emission control line Ei.

The sixth transistor T6 may be electrically connected between the first transistor T1 and the light emitting element LD. A gate electrode of the sixth transistor T6 may be electrically connected to the emission control line Ei. The sixth transistor T6 may be turned off in case that the emission control signal (e.g., the emission control signal having a gate-off voltage (high level voltage)) is supplied to the emission control line Ei, and be turned on in case that the emission control signal is not supplied to the emission control line Ei.

The seventh transistor T7 may be electrically connected between the third power source VINT and the anode electrode of the light emitting element LD. A gate electrode of the seventh transistor T7 may be electrically connected to an (i+1)th scan line Si+1. The seventh transistor T7 may be turned on and supply the voltage of the third power source VINT (see FIG. 1) to the anode electrode of the light emitting element LD in case that a scan signal is supplied to the (i+1)th scan line Si+1. The voltage of the third power source VINT may be set to a voltage lower than a voltage of a data signal. For example, the voltage of the third power source may be set equal to or lower than a minimum voltage of the data signal.

Although FIG. 2 illustrates that an anode initialization control line to which the gate electrode of the seventh transistor T7 is electrically connected is the (i+1)th scan line Si+1, the disclosure is not limited thereto. For example, in another embodiment, the gate electrode of the seventh transistor T7 may be electrically connected to the ith scan line Si. The voltage of the third power source VINT may be supplied to the anode electrode of the light emitting element LD via the seventh transistor T7 in case that the scan signal is supplied to the ith scan line Si.

The storage capacitor Cst may be electrically connected between the first power source ELVDD and the first node N1. The storage capacitor Cst may store a voltage corresponding to the data signal and a threshold voltage of the first transistor T1.

In order to more clearly describe technical effects of the disclosure, a principle in which an afterimage is generated in the display device 10 and threshold voltage compensation for preventing the generation of the afterimage will be described with reference to FIG. 3.

Figure 3:
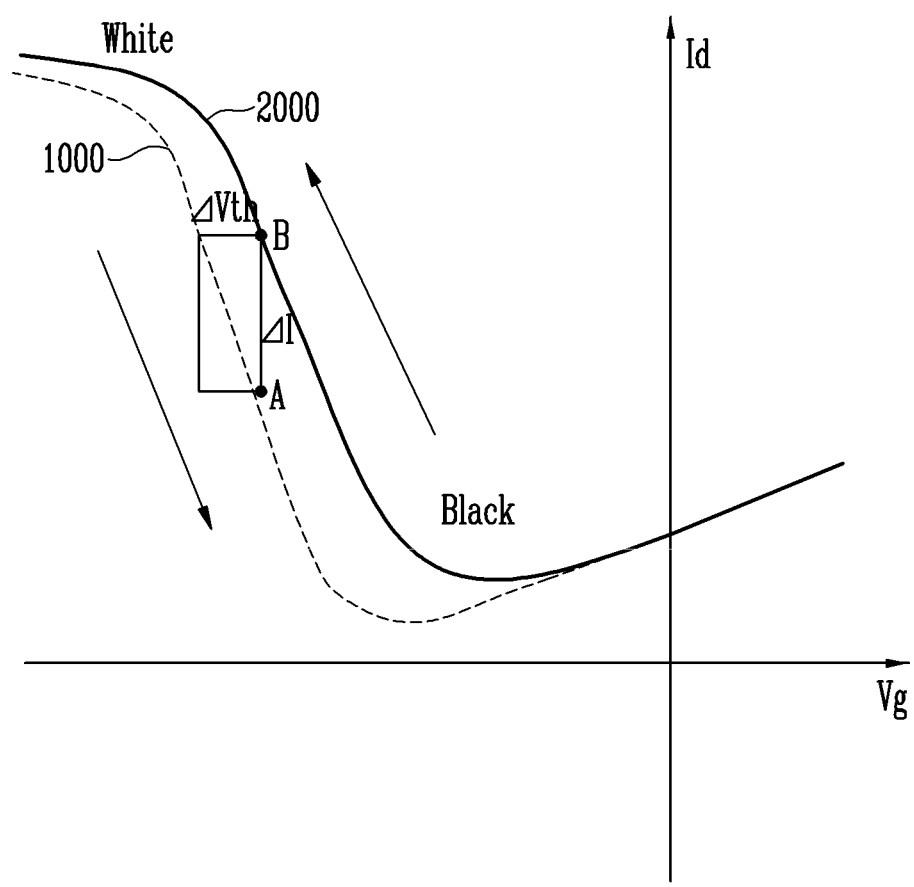
FIG. 3 is a schematic graph illustrating a threshold voltage compensation point of a transistor in accordance with an embodiment of the disclosure.

FIG. 3 is a schematic graph illustrating a threshold voltage compensation point of a transistor in accordance with an embodiment of the disclosure. FIG. 3 may be a graph illustrating a hysteresis characteristic of transistors TR.

An X axis of the graph shown in FIG. 3 may be gate voltage Vg, and a Y axis of the graph shown in FIG. 3 may be drain current Id. Voltage-current characteristics 1000 and 2000 may be characteristics according to a voltage applied to the transistor TR.

Referring to FIG. 3, in case that the pixel PXL emits light (e.g., continuously emits light), the transistor TR may have a first voltage-current characteristic 1000. In case that the pixel PXL does not emit light, the transistor TR may have a second voltage-current characteristic 2000.

Experimentally, the transistors TR may have a hysteresis characteristic. The hysteresis characteristic may generate an afterimage in the display device 10. However, a method of compensating for a voltage corresponding to a threshold voltage may be used to prevent the generation of the afterimage.

For example, the pixels PXL may include a first pixel disposed in a first display area and a second pixel disposed in a second display area disposed adjacent to the first display area. In a first time period, the first pixel may emit light, and the second pixel may not emit light. In a second time period posterior to the first time period, the first pixel and the second pixel may emit light. In case that the first pixel and the second pixel emit light in the second time period, transistors TR of the first pixel and the second pixel may have different voltage-current characteristics 1000 and 2000, and an instantaneous afterimage may be generated, in which a boundary area of the first pixel and the second pixel is viewed.

The transistor TR may have a hysteresis characteristic such that the change of the drain current Id according to the gate voltage Vg that varies according to the voltage-current characteristics 1000 and 2000.

For example, in case that a brightness of the pixel PXL is changed from a high grayscale (e.g., a white grayscale) to an intermediate grayscale, an absolute value |Vg| of a gate voltage of the transistor TR may be changed from a large value to a small value as shown in the first voltage-current characteristic 1000. Since a gate voltage |Vg| having a relatively large absolute value in the high grayscale is first applied to the transistor TR, the drain current Id of the transistor TR may correspond to point "A" in case that a gate voltage Vg corresponding to the intermediate grayscale is applied to the transistor TR in a state in which the absolute value |Vth| of a threshold voltage of the transistor TR increases.

In case that the brightness of the pixel PXL is changed from a low grayscale (e.g., a black grayscale) (e.g., less than grayscale 48) to an intermediate grayscale, the absolute value |Vg| of the gate voltage of the transistor TR may be changed from a small value to a large value as shown in the second voltage-current characteristic 2000. Since a gate voltage |Vg| having a relatively small absolute value in the low grayscale is first applied to the transistor TR, the drain current Id of the transistor TR may correspond to point "B" in case that a gate voltage Vg corresponding to the intermediate grayscale is applied to the transistor TR in a state in which the absolute value |Vth| of the threshold voltage of the transistor TR decreases by ΔVth.

Therefore, as the transistor TR has a hysteresis characteristic, another current may flow according to the previous brightness of the corresponding pixel even in case that a same gate voltage Vg is applied to the transistor TR and express the brightness of an intermediate grayscale. For example, a current in case that the previous brightness of the pixel to which the gate voltage Vg for expressing the brightness of the intermediate grayscale is applied is a high grayscale may be different by ΔI from a current in case that the previous brightness of the pixel to which the gate voltage Vg for expressing the brightness of the intermediate grayscale is applied is a low grayscale as shown in FIG. 3. A difference between the currents may result in an afterimage. Accordingly, it is necessary to decrease the above-described risk by compensating for a voltage corresponding to a threshold voltage difference ΔVth as the absolute value |Vth| of the threshold voltage.

The afterimage may be generated in case that the display device 10 having high resolution expresses the brightness of a low grayscale. The display device 10 having a high resolution may include a relatively large number of pixels PXL, and it may be difficult to sufficiently secure a scan on-time as an active time period of the scan signal. This may decrease a voltage charging rate of the data driver 120 and the scan driver 120. The threshold voltage difference ΔVth may further increase as a voltage approaches to a low grayscale (black) region from a high grayscale (white) region. Since a voltage having a larger magnitude is compensated in the low grayscale region, an afterimage may be generated due to a voltage difference between pixels PXL in case that the voltage is not sufficiently compensated as the scan on-time is decreased.

The scan on-time may be associated with initialization of the display device 10, an afterimage problem, a luminance in low grayscale, and a color deviation. For example, in case that the scan on-time is not sufficiently secured, it may be difficult for an initialization signal (or synchronization signal) to be supplied accurately, and a risk that an afterimage will be generated due to a difference between luminances in high and low grayscales may increase. A luminance in low grayscale may be non-uniform due to shortage of a voltage charging rate of the pixel PXL, and a risk that a color deviation occurs in a panel may increase.

In the display device 10 in accordance with an embodiment of the disclosure, the switching transistor Ts may be operated in different modes according to a driving frequency, thereby sufficiently securing a scan on-time and a scan delay margin. The probability that an afterimage will be generated in low grayscale can be decreased, and an image quality of the display device 10 can be improved.

Figure 4:
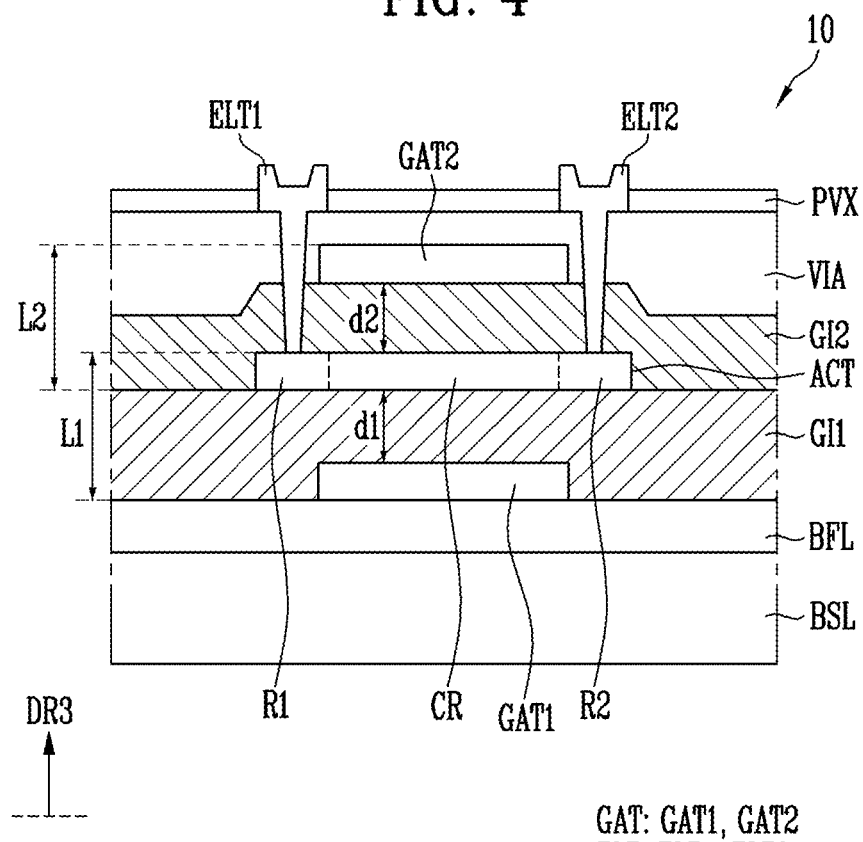
FIG. 4 is a schematic cross-sectional view illustrating a switching transistor in accordance with an embodiment of the disclosure.
Figure 5:
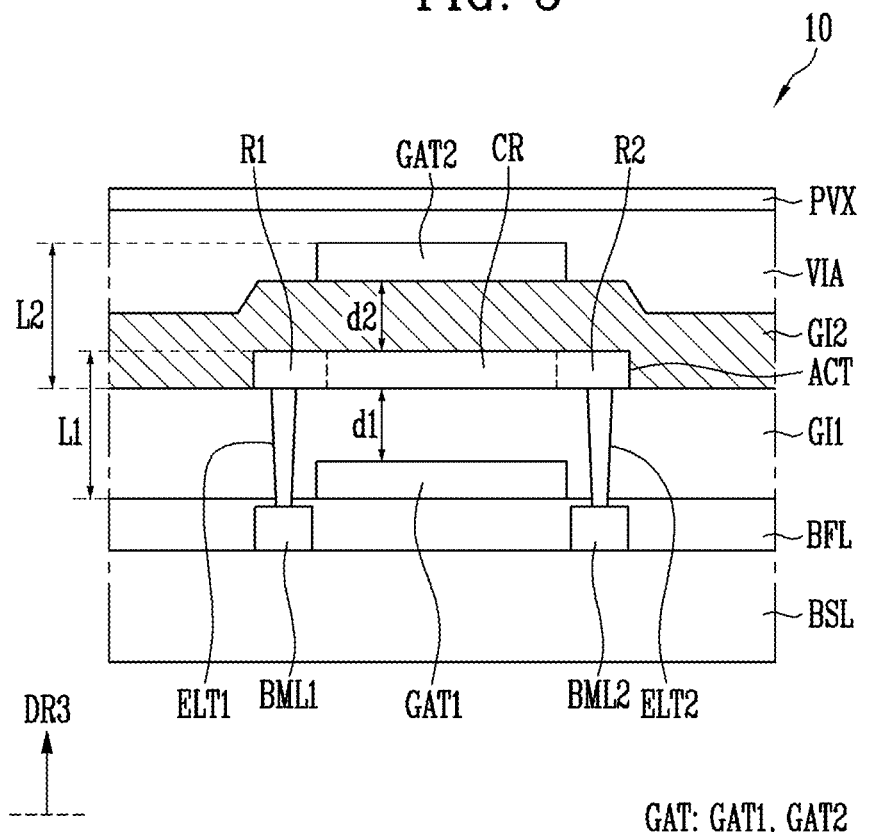
FIG. 5 is a schematic cross-sectional view illustrating a switching transistor in accordance with an embodiment of the disclosure.

A structural characteristic and the like of the switching transistor Ts will be described with reference to drawings from FIG. 4. FIGS. 4 and 5 are schematic cross-sectional views illustrating a switching transistor in accordance with an embodiment of the disclosure. For example, the switching transistor Ts shown in FIGS. 4 and 5 may be one of the second to seventh transistors T2 to T7.

FIG. 4 is a schematic cross-sectional view of a switching transistor Ts in accordance with an embodiment of the disclosure. FIG. 5 may be a schematic cross-sectional view of a switching transistor Ts in accordance with an embodiment of the disclosure.

An embodiment of the disclosure will be described with reference to FIG. 4.

Referring to FIG. 4, the display device 10 may include a base layer BSL, a buffer layer BFL, a first layer L1, a second layer L2, a via layer VIA, a protective layer PVX, and an electrode ELT.

The base layer BSL may be a base substrate or a base member, which supports the display device 10. The base layer BSL may be a rigid substrate made of glass or the like. The base layer BSL may be a flexible substrate which is bendable, foldable, rollable, or the like. The base layer BSL may include an insulating material such as a polymer resin such as polyimide or the like. However, the disclosure is not necessarily limited thereto.

The buffer layer BFL may be disposed on the base layer BSL. The buffer layer BFL may include an inorganic material. The inorganic material may include, for example, at least one of silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), and silicon oxynitride ($SiO_xN_y$).

FIG. 4 illustrates that, for convenience, the buffer layer BFL is provided as a single layer. However, the disclosure is not limited thereto, and according to an embodiment, the buffer layer BFL may have a multi-layer structure.

The first layer L1 may be disposed on the buffer layer BFL. The first layer L1 may include a first gate electrode GAT1, a first gate insulating layer GI1, and an active layer ACT.

The second layer L2 may share the active layer ACT with the first layer L1, and be disposed on the first layer L1. The second layer L2 may include a second gate electrode GAT2, a second gate insulating layer GI2, and the active layer ACT.

According to an embodiment, the switching transistor Ts may be driven based on one of the first layer L1 and the second layer L2 according to an operation mode in a time period.

For example, in case that the switching transistor Ts is operated in the first driving mode, a first gate signal may be supplied to the first gate electrode GAT1 of the first layer L1, and a second gate signal may not be supplied to the second gate electrode GAT2 of the second layer L2. In case that the switching transistor Ts is operated in the second driving mode, the first gate signal may not be supplied to the first gate electrode GAT1 of the first layer L1, and the second gate signal may be supplied to the second gate electrode GAT2 of the second layer L2. In this specification, the first gate signal may be a gate signal supplied to the first gate electrode GAT1, and the second gate signal may be a gate signal supplied to the second gate electrode GAT2. A gate signal may include a first gate signal and a second gate signal.

However, the disclosure is not limited thereto. In another embodiment, in case that the switching transistor Ts is operated in the first driving mode, the second gate signal may be supplied to the second gate electrode GAT2 of the second layer L2, and the first gate signal may not be supplied to the first gate electrode GAT1 of the first layer L1. In case that the switching transistor Ts is operated in the second driving mode, the second gate signal may not be supplied to the second gate electrode GAT2 of the second layer L2, and the first gate signal may be supplied to the first gate electrode GAT1 of the first layer L1.

A driving mode of the switching transistor Ts may be determined based on a driving frequency. This will be described below.

The first gate electrode GAT1 may be disposed on the buffer layer BFL. The first gate electrode GAT1 may overlap at least a portion of the buffer layer BFL in a plan view. The first gate electrode GAT1 may be disposed adjacent to the active layer ACT with the first gate insulating layer GI1 interposed between the first gate electrode GAT1 and the active layer ACT.

According to an embodiment, the first gate electrode GAT1 may include a conductive material. For example, the first gate electrode GAT1 may include at least one metal such as gold (Au), silver (Ag), aluminum (Al), molybdenum (Mo), chromium (Cr), titanium (Ti), nickel (Ni), neodymium (Nd), copper (Cu), the like, and alloys of the metals.

The first gate insulating layer GI1 may be disposed on the first gate electrode GAT1. At least a portion of the first gate insulating layer GI1 may be disposed between the first gate electrode GAT1 and the active layer ACT. The first gate insulating layer GI1 may entirely cover the first gate electrode GAT1.

The first gate insulating layer GI1 may have a first thickness d1 in a thickness direction of the base layer BSL in an area between the first gate electrode GAT1 and the active layer ACT. The first thickness d1 may correspond to an area in which the first gate electrode GAT1 and the active layer ACT overlap with each other in a plan view.

The active layer ACT may be disposed on the first gate insulating layer GI1. The active layer ACT may include a first region R1, a channel region CR, and a second region R2. The first region R1 and the second region R2 may be respectively disposed adjacent to a side and another side of the channel region CR.

According to a type (e.g., a p-type or a n-type) of the active layer ACT, the first region R1 may be a source region to which a source electrode is electrically connected or a drain region to which a drain electrode is electrically connected. The second region R2 may be the source region to which the source electrode is electrically connected or the drain region to which the drain electrode is electrically connected. For example, in case that the active layer ACT is a p-type, a region to which an electrode having a relatively low voltage applied is electrically connected may be the drain region, and a region to which an electrode having a relatively high voltage applied is electrically connected may be the source region. In case that the active layer ACT is an n-type, a region to which an electrode having a relatively low voltage applied is electrically connected may be the source region, and a region to which an electrode having a relatively high voltage applied is electrically connected may be the drain region.

The channel region CR of the active layer ACT may have a width smaller than a width of each of the first gate electrode GAT1 and the second gate electrode GAT2. For example, at least a portion of each of the first gate electrode GAT1 and the second gate electrode GAT2 may not overlap the channel region CR in a plan view. The width may be in a length direction of the base layer BSL in a plan view. The channel region CR of the active layer ACT may overlap the first gate electrode GAT1 and the second gate electrode GAT2 in a plan view.

The active layer ACT may include a semiconductor. For example, the active layer ACT may include at least one of poly-silicon, Low Temperature Polycrystalline Silicon (LTPS), amorphous silicon, and an oxide semiconductor.

In the active layer ACT, a current may flow from the first region R1 to the second region R2 or from the second region R2 to the first region R1 in case that a gate signal is applied to the first gate electrode GAT1 or the second gate electrode GAT2. In the display device 10 in accordance with an embodiment of the disclosure, the first layer L1 and the second layer L2 may share an active layer ACT, and the switching transistor Ts may be operated in different modes. For example, the switching transistor Ts may be operated based on the first gate signal applied to the first gate electrode GAT1, or be operated based on the second gate signal applied to the second gate electrode GAT2.

The second gate insulating layer GI2 may be disposed on the active layer ACT. At least a portion of the second gate insulating layer GI2 may be disposed between the second gate electrode GAT2 and the active layer ACT. The second gate insulating layer GI2 may entirely cover the active layer ACT.

The second gate insulating layer GI2 may contact the first gate insulating layer GI1 with the active layer ACT interposed between the first gate insulating layer GI1 and the second gate insulating layer GI2.

The switching transistor Ts may be selectively driven based on one of the second gate electrode GAT2 disposed on the second gate insulating layer GI2 and the first gate electrode GAT1 disposed on the first gate insulating layer GI1. For example, the switching transistor Ts may be driven based on the second layer L2 including the second gate insulating layer GI2 (e.g., based on the second gate signal applied to the second layer L2), or be driven based on the first layer L1 including the first gate insulating layer GI1 (e.g., based on the first gate signal applied to the first layer L1).

The second gate insulating layer GI2 may have a second thickness d2 in a thickness direction of the base layer BSL in an area between the second gate electrode GAT2 and the active layer ACT. The second thickness d2 may correspond to an area in which the second gate electrode GAT2 and the active layer ACT overlap with each other in a plan view.

The first gate insulating layer GI1 and the second gate insulating layer GI2 may have different dielectric constants. The first gate insulating layer GI1 may have a first dielectric constant, and the second gate insulating layer GI2 may have a second dielectric constant. The second dielectric constant of the second gate insulating layer GI2 and the first dielectric constant of the first gate insulating layer GI1 may be different from each other. According to an embodiment, the first gate insulating layer GI1 and the second gate insulating layer GI2 may include different materials.

According to an embodiment, the first dielectric constant may be greater than the second dielectric constant. For example, the first dielectric constant may be equal to or greater than about 7 (for example, large dielectric constant or a relatively large dielectric constant), and the second dielectric constant may be less than about 7 (for example, small dielectric constant or a relatively small dielectric constant).

In case that the switching transistor Ts is operated in the first driving mode, a gate signal may be applied to a gate electrode GAT corresponding to a gate insulating layer GI having a relatively large dielectric constant. According to an embodiment, the gate insulating layer GI may include a first gate insulating layer GI1 and a second gate insulating layer GI2, and the gate electrode GAT may include a first gate electrode GAT1 and a second gate electrode GAT2.

In case that the first dielectric constant is greater than the second dielectric constant, the first gate signal may be applied to the first gate electrode GAT1 corresponding to the first gate insulating layer GI1 having a relatively large dielectric constant in case that the switching transistor Ts is operated in the first driving mode. Accordingly, the switching transistor Ts may be operated.

In case that the switching transistor Ts is operated in the second driving mode, a gate signal may be applied to a gate electrode GAT corresponding to a gate insulating layer GI having a relatively small dielectric constant. In case that the first dielectric constant is greater than the second dielectric constant, the second gate signal may be applied to the second gate electrode GAT2 corresponding to the second gate insulating layer GI2 having a relatively small dielectric constant, and the switching transistor Ts may be operated. However, the disclosure is not limited thereto.

According to an embodiment, the first dielectric constant may be smaller than the second dielectric constant. For example, the second dielectric constant may be equal to or greater than about 7, and the first dielectric constant may be less than about 7.

In case that the switching transistor Ts is operated in the first driving mode, the second gate signal may be applied to the second gate electrode GAT2 corresponding to the second gate insulating layer GI2 having a relatively large dielectric constant, and the switching transistor Ts may be operated. In case that the switching transistor Ts is operated in the second driving mode, the first gate signal may be supplied to the first gate electrode GAT1 corresponding to the first gate insulating layer GI1 having a relatively small dielectric constant, sand the switching transistor Ts may be operated. However, the disclosure is not limited thereto.

According to an embodiment, the first driving mode may be an operation mode of the switching transistor Ts in which the switching transistor Ts is driven by applying a gate signal to a gate electrode GAT corresponding to a gate insulating layer GI having a large dielectric constant. According to an embodiment, the second driving mode may be an operation mode of the switching transistor Ts in which the switching transistor Ts is driven by applying a gate signal to a gate electrode GAT corresponding to a gate insulating layer GI having a small dielectric constant.

In an embodiment, the first gate electrode GAT1 and the second gate electrode GAT2 may have different dielectric constants, and a gate signal may be applied to the first gate electrode GAT1 or the second gate electrode GAT2 according to a driving frequency. Therefore, the switching transistor Ts may be operated in different modes.

According to an embodiment, in case that the driving frequency corresponds to a high frequency band (e.g., equal to or greater than about 60 Hz), the switching transistor Ts may be driven based on a gate electrode GAT corresponding to a gate insulating layer GI having a relatively large dielectric constant.

For example, in case that the first gate insulating layer GI1 has a dielectric constant greater than a dielectric constant of the second gate insulating layer GI2, the switching transistor Ts may be driven using the first gate electrode GAT1 corresponding to the first gate insulating layer GI1 having a relatively large dielectric constant in case that the driving frequency is a high frequency band. In another embodiment, in case that the second gate insulating layer GI2 has a dielectric constant greater than a dielectric constant of the first gate insulating layer GI1, the switching transistor Ts may be driven using the second gate electrode GAT2 corresponding to the second gate insulating layer GI2 having a relatively large dielectric constant in case that the driving frequency is a high frequency band.

According to an embodiment, in case that the driving frequency corresponds to a low frequency band (e.g., less than about 60 Hz), the switching transistor Ts may be driven based on a gate electrode GAT corresponding to a gate insulating layer GI having a relatively small dielectric constant.

For example, in case that the first gate insulating layer GI1 has a dielectric constant greater than a dielectric constant of the second gate insulating layer GI2, the switching transistor Ts may be driven using the second gate electrode GAT2 corresponding to the second gate insulating layer GI2 having a relatively small dielectric constant in case that the driving frequency is a low frequency band. In another embodiment, in case that the second gate insulating layer GI2 has a dielectric constant greater than a dielectric constant of the first gate insulating layer GI1, the switching transistor Ts may be driven using the first gate electrode GAT1 corresponding to the first gate insulating layer GI1 having a relatively small dielectric constant in case that the driving frequency is a low frequency band.

In the display device 10 in accordance with an embodiment of the disclosure, the switching transistor Ts may include the first gate electrode GAT1 and the second gate electrode GAT2, and whether the first gate signal is applied to the first gate electrode GAT1 or whether the second gate signal is applied to the second gate electrode GAT2 may be determined according to a frequency of the gate signal and a dielectric constant of the gate insulating layer GI.

According to an embodiment, the first gate insulating layer GI1 may include at least one of zirconium oxide ($Zr_xO_y$), hafnium oxide ($Hf_xO_y$), yttrium oxide ($Y_xO_y$), strontium oxide ($Sr_xO_y$), lanthanum oxide ($La_2O_3$), barium oxide ($Ba_xO_y$), tantalum oxide ($Ta_xO_y$), and titanium oxide ($Ti_xO_y$) and have a dielectric constant of equal to or greater than about 7. According to an embodiment, the second gate insulating layer GI2 may include at least one of silicon oxide ($SiO_x$), silicon nitride ($SiN_x$), and silicon oxynitride ($SiO_xN_y$) and have a dielectric constant of less than about 7.

In another embodiment, the first gate insulating layer GI1 may include a material having a dielectric constant of less than about 7, and the second gate insulating layer GI2 may include a material having a dielectric constant of equal to or greater than about 7.

According to an embodiment, the first thickness d1 and the second thickness d2 may be the same. According to an embodiment, the first thickness d1 and the second thickness d2 may be different from each other. For example, in case that the display device 10 is operated in the first driving mode in a high frequency band, the first gate insulating layer GI1 may have a thickness less than the thickness of the second gate insulating layer GI2 in a thickness direction of the base layer BSL. In case that the display device 10 applies a signal to the first gate electrode GAT1 corresponding to the first gate insulating layer GI1 in the high frequency band, the first gate insulating layer GI1 may have a thickness less than the thickness of the second gate insulating layer GI2 in a thickness direction of the base layer BSL. In case that the display device 10 applies a signal to the second gate electrode GAT2 corresponding to the second gate insulating layer GI2 in the high frequency band, the second gate insulating layer GI2 may have a thickness less than the thickness of the first gate insulating layer GI1 in a thickness direction of the base layer BSL. For example, a thickness of a gate insulating layer GI having a relatively large dielectric constant may be less than a thickness of another gate insulating layer GI in a thickness direction of the base layer BSL.

The second gate electrode GAT2 may be disposed on the second gate insulating layer GI2.

The second gate electrode GAT2 may include a conductive material. For example, the second gate electrode GAT2 may include at least one metal such as gold (Au), silver (Ag), aluminum (Al), molybdenum (Mo), chromium (Cr), titanium (Ti), nickel (Ni), neodymium (Nd), copper (Cu), the like, and alloys of the metals.

The via layer VIA may be disposed on the second gate electrode GAT2. The via layer VIA may entirely cover the second gate electrode GAT2. At least a portion of the via layer VIA may contact at least a portion of the second gate insulating layer GI2.

The via layer VIA may include an organic material. In an embodiment, the via layer VIA may include at least one of an acrylic resin, an epoxy resin, a phenolic resin, a polyamide resin, a polyimide resin, a polyester resin, a polyphenylene sulfide resin, and benzocyclobutene. However, the disclosure is not limited thereto.

The protective layer PVX may be disposed on the via layer VIA. The protective layer PVX may include an inorganic material. According to an embodiment, the protective layer PVX may include at least one of silicon nitride ($SiN_x$), aluminum nitride ($AlN_x$), titanium nitride ($TiN_x$), silicon oxide ($SiO_x$), aluminum oxide ($Al_xO_y$), titanium oxide ($TiO_x$), silicon oxycarbide ($SiO_xC_y$), and silicon oxynitride ($SiO_xN_y$). However, the disclosure is not limited thereto.

The electrode ELT may be disposed on the via layer VIA. The electrode ELT may include a first electrode ELT1 and a second electrode ELT2. The electrode ELT may be electrically connected to the active layer ACT (e.g., the first region R1 and the second region R2) through a contact part penetrating the protective layer PVX and the second gate insulating layer GI2. The first electrode ELT1 may be electrically connected to the first region R1, and the second electrode ELT2 may be electrically connected to the second region R2.

The first electrode ELT1 may be a source electrode, and the second electrode ELT2 may be a drain electrode. However, the disclosure is not limited thereto. In another embodiment, the first electrode ELT1 may be a drain electrode, and the second electrode ELT2 may be a source electrode. According to an embodiment, the first electrode ELT1 and the second electrode ELT2 may be electrically connected respectively to the anode electrode and the cathode electrode of the light emitting element LD.

The electrode ELT may be electrically connected to the first region R1 and the second region R2 while penetrating the protective layer PVX, the via layer VIA, and the second gate insulating layer GI2.

The first electrode ELT1 may be electrically connected to the first region R1. The second electrode ELT2 may be electrically connected to the second region R2. The first electrode ELT1 may be one of the source electrode and the drain electrode, and the second electrode ELT2 may be another one of the source electrode and the drain electrode.

Another embodiment of the disclosure will be described with reference to FIG. 5. The embodiment of FIG. 5 and the embodiment of FIG. 4 are different at least in that positions of source and drain electrodes electrically connected to the active layer ACT in FIGS. 4 and 5 are different from each other. Hereinafter, referring to FIG. 5, portions different from the embodiment of FIG. 4 will be described.

An auxiliary electrode layer BML may be disposed on the base layer BSL. The auxiliary electrode layer BML may be disposed between the first gate insulating layer GI1 and the base layer BSL. The auxiliary electrode layer BML may include a first auxiliary electrode layer BML1 and a second auxiliary electrode layer BML2.

The auxiliary electrode layer BML may include a conductive material. For example, the auxiliary electrode layer BML may include a wiring material including a metal such as gold (Au), silver (Ag), aluminum (Al), molybdenum (Mo), chromium (Cr), titanium (Ti), nickel (Ni), neodymium (Nd), copper (Cu), or an alloy thereof.

The auxiliary electrode layer BML may be electrically connected to the pixel circuit (see, e.g., PXC of FIG. 2) and the lines (see, e.g., the ith scan line Si, the emission control line Ei, and the data line Dj of FIG. 2). The buffer layer BFL may be disposed on the auxiliary electrode layer BML. The buffer layer BFL may entirely cover the auxiliary electrode layer BML.

The auxiliary electrode layer BML may be electrically connected to each of the first region R1 and the second region R2 through a contact part penetrating the first gate insulating layer GI1 and the buffer layer BFL. The first auxiliary electrode layer BML1 and the second auxiliary electrode layer BML2 may be electrically connected respectively to the first region R1 and the second region R2 through a contact part penetrating the first gate insulating layer GI1 and the buffer layer BFL. Accordingly, the auxiliary electrode layer BML may form a source electrode and a drain electrode with respect to the active layer ACT. For example, the first auxiliary electrode layer BML1 and the second auxiliary electrode layer BML2 may respectively form a source electrode and a drain electrode with respect to the active layer ACT.

Figure 6:
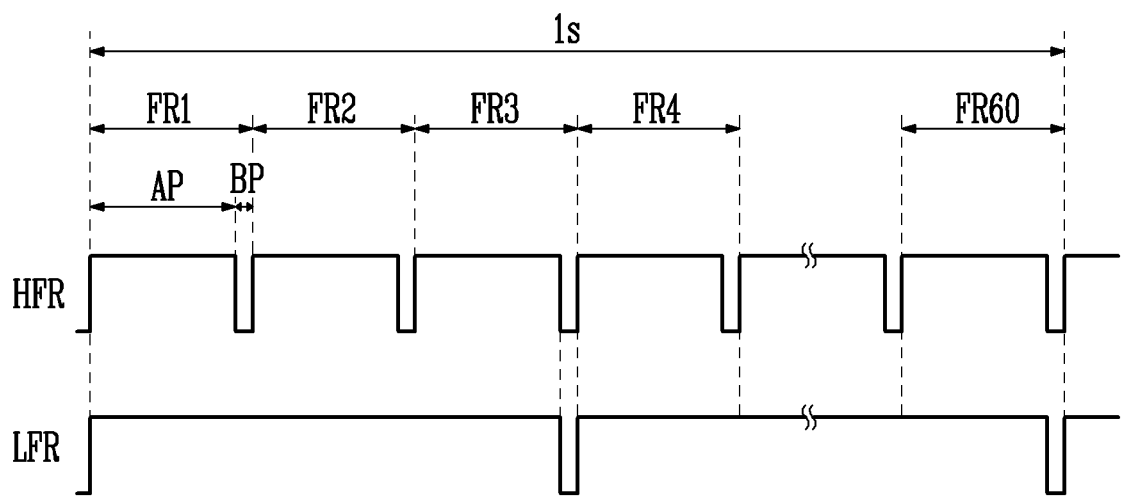
FIG. 6 is a schematic diagram illustrating a driving frequency of a display device in accordance with an embodiment of the disclosure.
Figure 7:
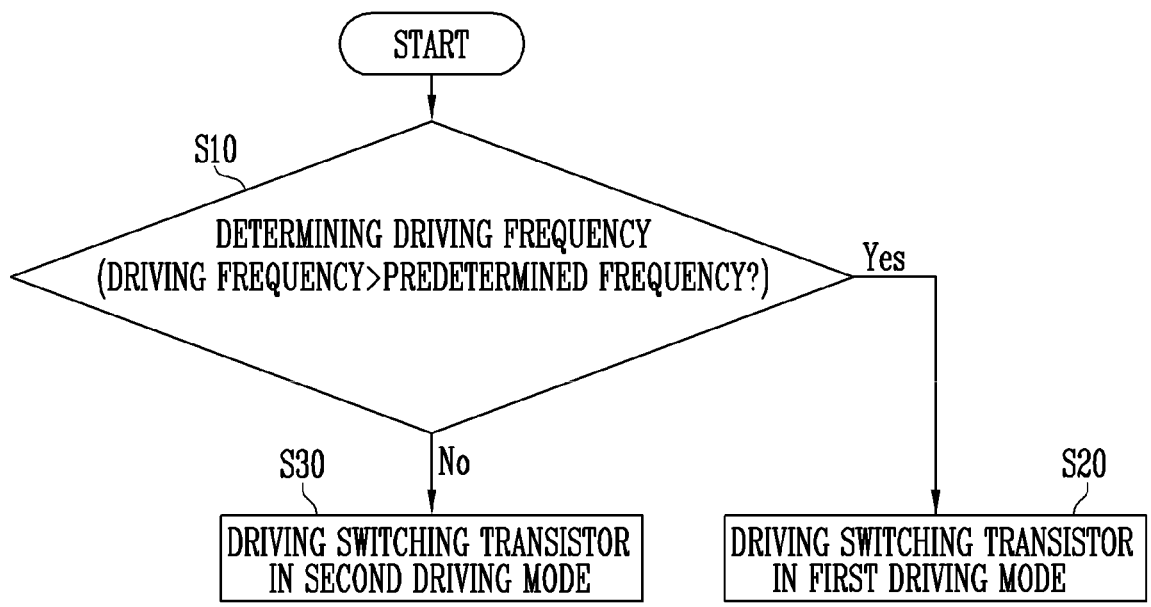
FIG. 7 is a schematic flowchart illustrating a driving method of a display device in accordance with an embodiment of the disclosure.

FIG. 6 is a schematic diagram illustrating a driving frequency of the display device in accordance with an embodiment of the disclosure. FIG. 7 is a schematic flowchart illustrating a driving method of the display device in accordance with an embodiment of the disclosure.

Hereinafter, a driving method of the display device 10 in accordance with an embodiment of the disclosure will be described with reference to FIGS. 6 and 7.

A driving frequency for operating the switching transistor Ts will be briefly described.

According to an embodiment, the display device 10 may determine a driving frequency. For example, the driving frequency may be determined by the controller 150.

Referring to FIG. 6, the display device 10 may be driven at a frequency corresponding to a first frequency HFR of a first range or a second frequency LFR of a second range. The first frequency HFR may be a relatively high frequency, and the second frequency LFR may be a relatively low frequency. For example, the first frequency HFR may be equal to or greater than about 60 Hz, and the second frequency LFR may be less than about 60 Hz.

For example, in case that the first frequency HFR is a frequency of about 60 Hz (see, e.g., FIG. 6), 60 frame periods FR1 to FR60 may exist for one second (1 s), and each of the frame periods may include an active period AP and a blank period BP. The active period AP may be a period in which the scan driver 110 outputs a scan signal and the data driver 120 outputs a data signal, thereby supplying data voltages to the pixels PX. The black period BP may be a pause period inserted between active periods AP. Therefore, during the blank period BF, the scan driver 110 may not output scan signals and the data driver 120 may not output data voltages. According to an embodiment, the first frequency HFR may be a frequency corresponding to a driving signal transferred to the switching transistor Ts to drive the switching transistor Ts in case that the display device 10 is driven at a high frequency (e.g., in case that an image displayed in the display device 10 is a moving image).

For example, in case that the second frequency LFR is a frequency of about 30 Hz (see, e.g., FIG. 6), 30 frame periods FR1 to FR30 may exist for one second (1 s). According to an embodiment, the second frequency LFR may be a frequency corresponding to a driving signal transferred to the switching transistor Ts to drive the switching transistor Ts in case that the display device 10 is driven at a low frequency (e.g., in case that an image displayed in the display device 10 is a still image).

According to an embodiment, whether the display device 10 is driven at the first frequency HFR or the second frequency LFR may be determined by the controller 150.

The controller 150 may determine a driving frequency. The controller 150 may determine a driving frequency and output the scan driver control signal SCS, and the scan driver 110 may output a scan signal of a driving frequency corresponding to the scan driver control signal SCS. The controller 150 may determine whether the switching transistor Ts is operated in the first driving mode or the second driving mode. Hereinafter, a driving method of the display device 10 will be described with reference to FIG. 7.

Referring to FIG. 7, the driving method of the display device 10 may include step S10 of determining a driving frequency (driving frequency>predetermined frequency). In the step S10 of the determining of the driving frequency, in order to determine an operation mode of the switching transistor Ts, a driving frequency determined by the controller 150 may be compared with a frequency (e.g., a predetermined or selectable frequency) (e.g., about 60 Hz), and an operation mode of the switching transistor Ts may be selected according to a result obtained by comparing the driving frequency with the frequency.

The driving method of the display device 10 may include a step of selectively driving of the switching transistor Ts. The step of the selectively driving of the switching transistor Ts may include step S20 of driving the switching transistor Ts in a first driving mode or step S30 of driving the switching transistor Ts in a second driving mode.

In case that a first frequency HFR of a first range is determined as the driving frequency, the switching transistor Ts may be driven in the first driving mode. In case that a second frequency LFR of a second range is determined as the driving frequency, the switching transistor Ts may be driven in the second driving mode.

For example, the controller 150 may apply a control signal to the scan driver 110 or the data driver 120 to output a signal corresponding to the driving frequency, and the scan driver 110 or the data driver 120 may apply the driving frequency corresponding to the control signal to the switching transistor Ts.

In case that the driving frequency applied from the controller 150 is equal to or greater than the frequency (e.g., about 60 Hz), the switching transistor Ts of the display device 10 may be driven in the first driving mode (S20). In case that the driving frequency applied from the controller 150 is less than the frequency (e.g., about 60 Hz), the switching transistor Ts of the display device 10 may be driven in the second driving mode (S30).

The first driving mode may be a mode that the switching transistor Ts is driven by applying an electrical signal to a layer (e.g., the first layer L1 or the second layer L2) including a gate insulating layer (e.g., the first gate insulating layer GI1 or the second gate insulating layer GI2) having a dielectric constant of equal to or greater than about 7. For example, in case that the first gate insulating layer GI1 has a dielectric constant of equal to or greater than about 7 and the second gate insulating layer GI2 has a dielectric constant of less than about 7, the switching transistor Ts may be driven by applying the first gate signal to the first layer L1, and the switching transistor Ts may be driven. For example, in case that the second gate insulating layer GI2 has a dielectric constant of equal to or greater than about 7 and the first gate insulating layer GI1 has a dielectric constant of less than about 7, the switching transistor Ts may be driven by applying an electrical signal to the second layer L2.

In case that a scan signal of the first frequency HFR of a relatively high frequency is supplied to the pixel PXL as the switching transistor Ts is driven in the first driving mode, at least one technical effect may be provided. Hereinafter, the technical effect associated with this will be described in conjunction with Equation 1.

A drain current Id in the switching transistor Ts may be represented as shown in the following Equation 1.

$$Id = \frac{1}{2} u_n C_{ox} \frac{W}{L} (v_{GS} - V_T)^2 \quad \text{[Equation 1]}$$

In Equation 1, $u_n$ may be a mobility of electrons, $C_{ox}$ may be a capacitance of the gate insulating layer GI, W may be a width of the channel region CR disposed between the source electrode and the drain electrode, L may be a channel length, $v_{GS}$ may be a gate voltage, and VT may be a threshold voltage. $C_{ox}$ may be represented as shown in Equation 2.

$$C_{ox} = \frac{\varepsilon_{OX}}{t_{OX}} \quad \text{[Equation 2]}$$

In Equation 2, $\varepsilon_{OX}$ may be a dielectric constant, and $t_{OX}$ may be a thickness of the gate insulating layer GI. In Equation 2, the gate insulating layer GI may be a gate insulating layer GI corresponding to a gate electrode GAT to which a gate signal is applied.

In case that the dielectric constant increases, $\varepsilon_{OX}$ may increase, and $C_{ox}$ may also increase. As $C_{ox}$ increases, the drain current Id may also increase.

Experimentally, in case that the display device 10 is driven at a high frequency, the display device 10 may require a large amount of current, as compared with a case that the display device 10 is driven at a low frequency. Therefore, sufficient current may not be supplied, a refresh rate may decrease, and a flicker phenomenon or a luminance decrease phenomenon due to the decrease in the refresh rate may increase.

However, in case that the drain current Id increases, a sufficient current may be supplied to the display device 10. A threshold voltage compensation point ΔVth may be lowered, and the display device 10 may be driven in a high speed. Accordingly, the refresh rate of the display device 10 may increase, and a flicker phenomenon or a luminance decrease phenomenon due to the increase in the refresh rate may be prevented.

In the display device 10 in accordance with an embodiment of the disclosure, in case that the display device 10 is driven at a high frequency, the switching transistor Ts may be driven using a gate electrode (e.g., the first gate electrode GAT1 or the second gate electrode GAT2) corresponding to the gate insulating layer GI having a relatively large dielectric constant, and accordingly, the drain current Id may be increased. As the drain current Id is increased, a scan delay margin may be sufficiently secured, an afterimage at a low grayscale may be reduced, and the image quality of the display device 10 may be improved.

In order to display an image in a low grayscale region (e.g., a grayscale of less than grayscale 48), the switch transistor Ts of the display device 10 may be driven based on the layer L1 or L2 including the gate insulating layer GI having a relatively large dielectric constant.

For example, in case that the first gate insulating layer GI1 has a dielectric constant of equal to or greater than about 7 and the second gate insulating layer GI2 has a dielectric constant of less than about 7 in the low grayscale region, the transistor TR may be driven by applying the first gate signal to the first gate electrode GAT1, based on the first layer L1. In another embodiment, in case that the second gate insulating layer GI2 has a dielectric constant of equal to or greater than about 7 and the first gate insulating layer GI1 has a dielectric constant of less than about 7 in the low grayscale region, the switching transistor Ts may be driven by applying the second gate signal to the second gate electrode GAT2, based on the second layer L2.

In order to display an image in a high grayscale region (e.g., a grayscale of equal to or greater than about 48), the switching transistor Ts of the display device 10 may be driven based on the layer L1 or L2 including the gate insulating layer GI having a relatively small dielectric constant.

For example, in case that the first gate insulating layer GI1 has a dielectric constant of equal to or greater than about 7 and the second gate insulating layer GI2 has a dielectric constant of less than about 7 in the high grayscale region, the transistor TR may be driven by applying the second gate signal to the second gate electrode GAT2, based on the second layer L2. In another embodiment, in case that the second gate insulating layer GI2 has a dielectric constant of equal to or greater than about 7 and the first gate insulating layer GI1 has a dielectric constant of less than about 7 in the high grayscale region, the switching transistor Ts may be driven by applying the first gate signal to the first gate electrode GAT1, based on the first layer L1.

In case that a scan signal of the second frequency LFR of a relatively low frequency is applied to the pixel PXL (e.g., the switching transistor Ts), a lifetime of the display device 10 may be increased in case that the switching transistor Ts is driven in the second driving mode.

Experimentally, in case that the display device 10 is driven at a low frequency, the display device 10 may require a small amount of current, as compared with a case that the display device 10 is driven at a high frequency. Accordingly, as the switching transistor Ts is driven by applying a gate signal to a gate electrode GAT corresponding to the gate insulating layer GI having a small dielectric constant, the lifetime of the display device 10 may be increased.

For example, in case that the display device 10 is driven at a low frequency, the switching transistor Ts may be driven using a gate electrode corresponding to the gate insulating layer GI having a relatively small dielectric constant. As a layer having a large Equivalent Oxide Thickness (EOT) is used in Equations 1 and 2, $t_{OX}$ which corresponds to the EOT increases, and accordingly, Id may be decreased. In case that the switching transistor Ts is driven by applying a gate signal to a gate electrode GAT corresponding to the gate insulating layer GI having a dielectric constant of less than about 7 in the low frequency region, a leakage current may be decreased, and the lifetime of the display device 10 may be increased.

A method of manufacturing the display device 10 in accordance with embodiments of the disclosure will be described with reference to FIGS. 8 to 17. In FIGS. 8 to 17, descriptions of portions overlapping with those shown in FIGS. 1 to 7 will be simplified or will not be repeated.

Figure 8:
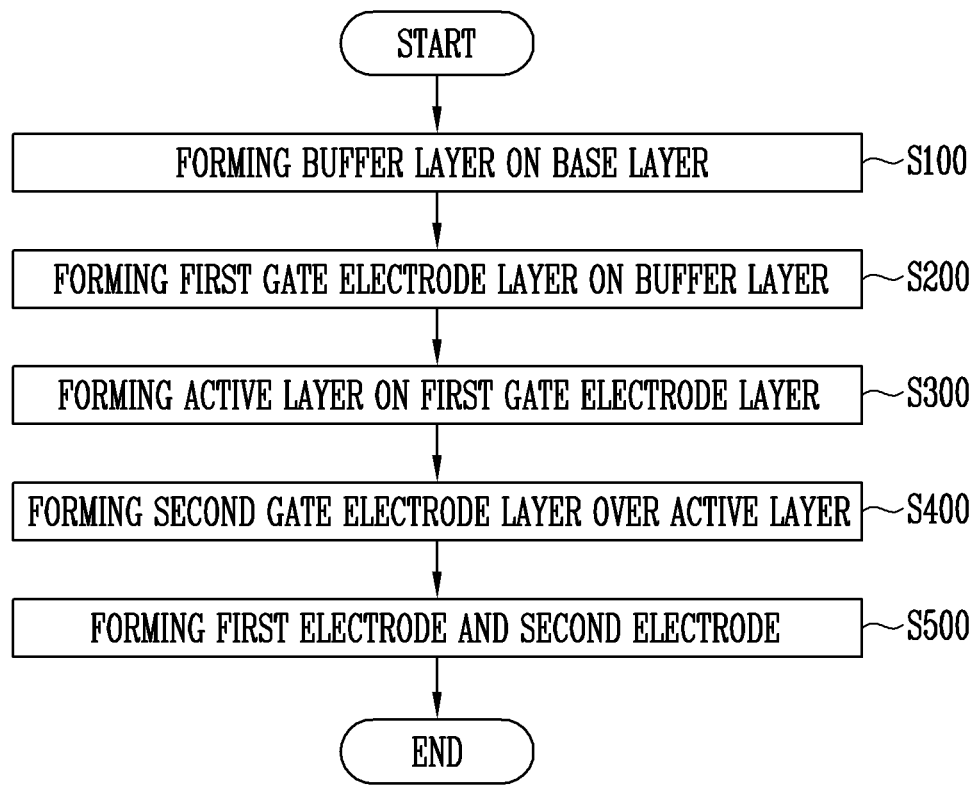
FIG. 8 is a schematic flowchart illustrating a method of manufacturing a display device in accordance with an embodiment of the disclosure.
Figure 9:
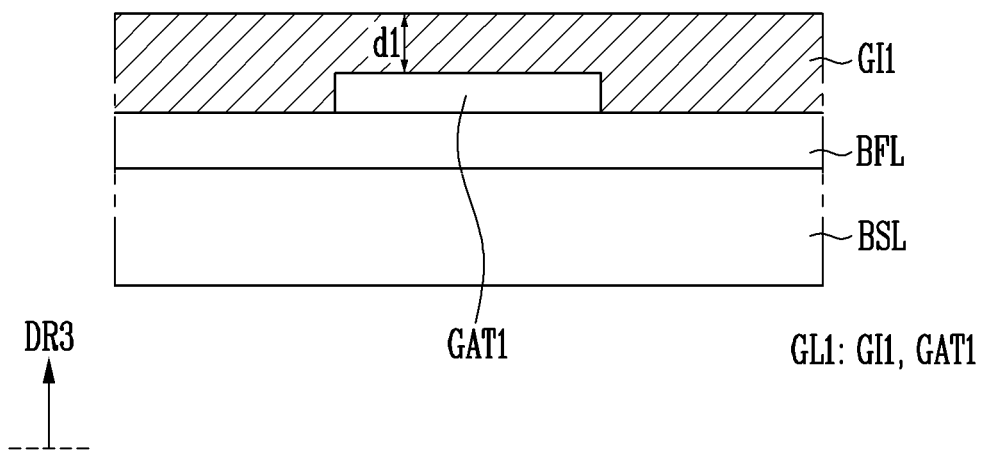
FIGS. 9 to 12 are schematic cross-sectional views illustrating process steps of a method of manufacturing a display device in accordance with an embodiment of the disclosure.
Figure 10:
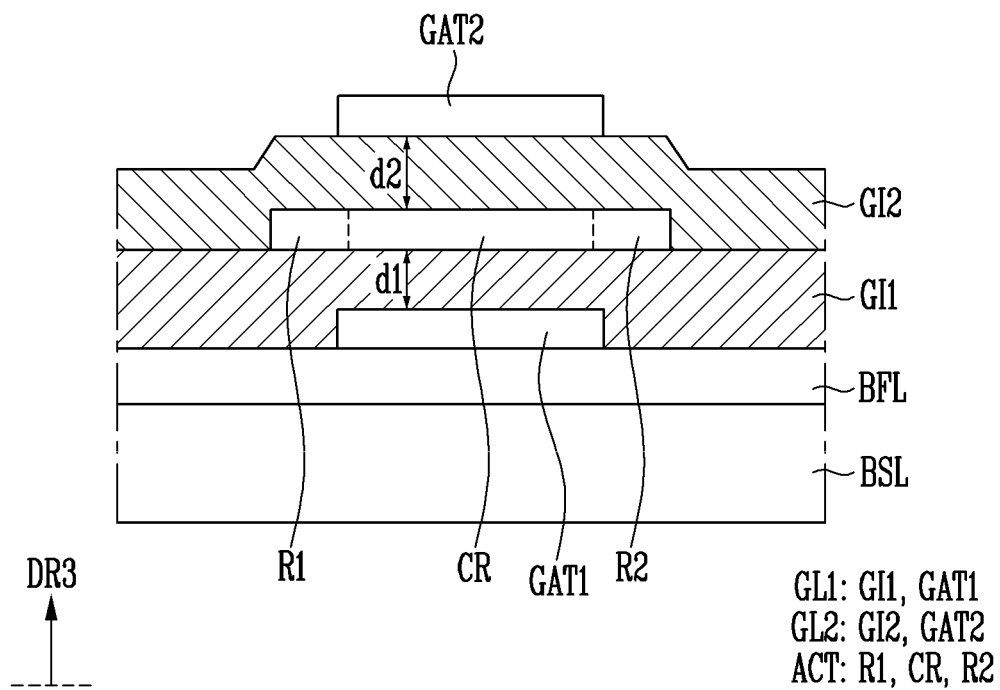
Figure 11:
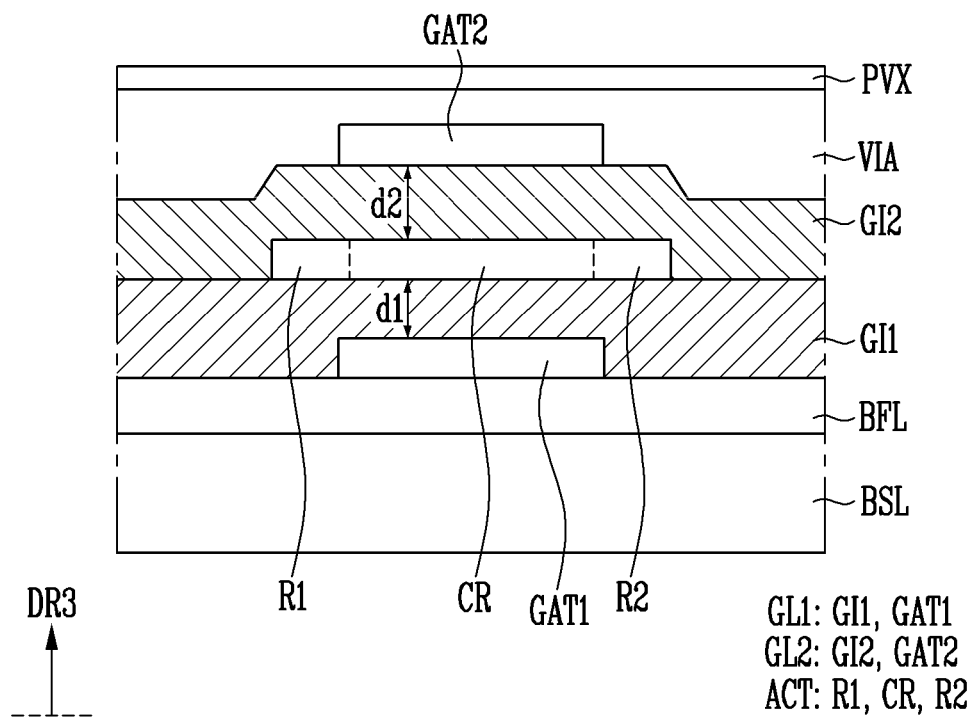
Figure 12:
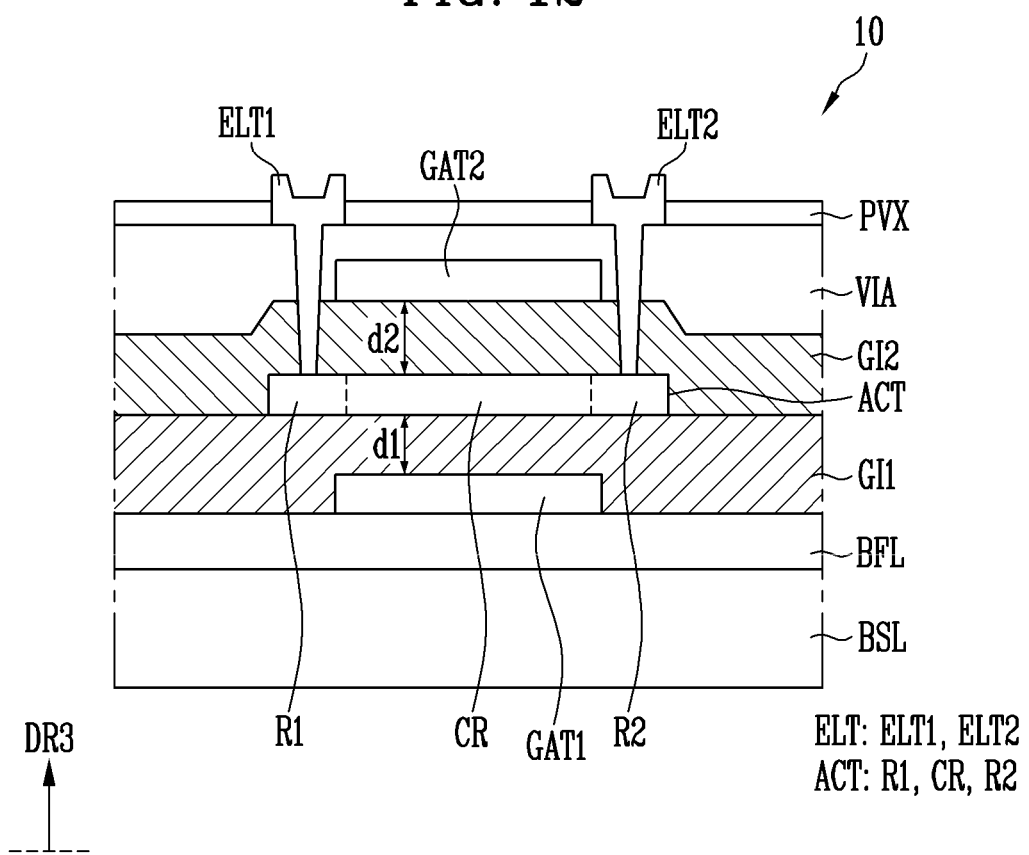
Figure 13:
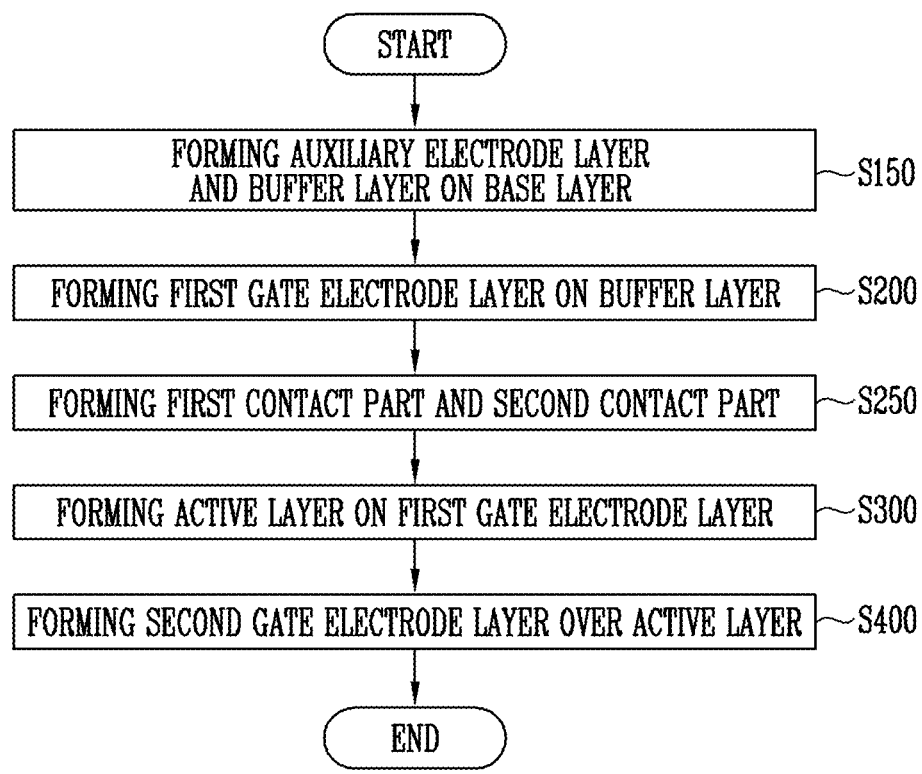
FIG. 13 is a schematic flowchart illustrating a method of manufacturing a display device in accordance with an embodiment of the disclosure.
Figure 14:
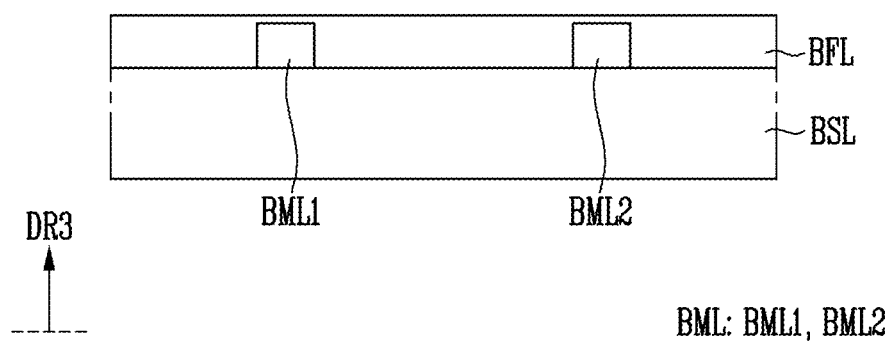
FIGS. 14 to 17 are schematic cross-sectional views illustrating process steps of a method of manufacturing a display device in accordance with an embodiment of the disclosure.
Figure 15:
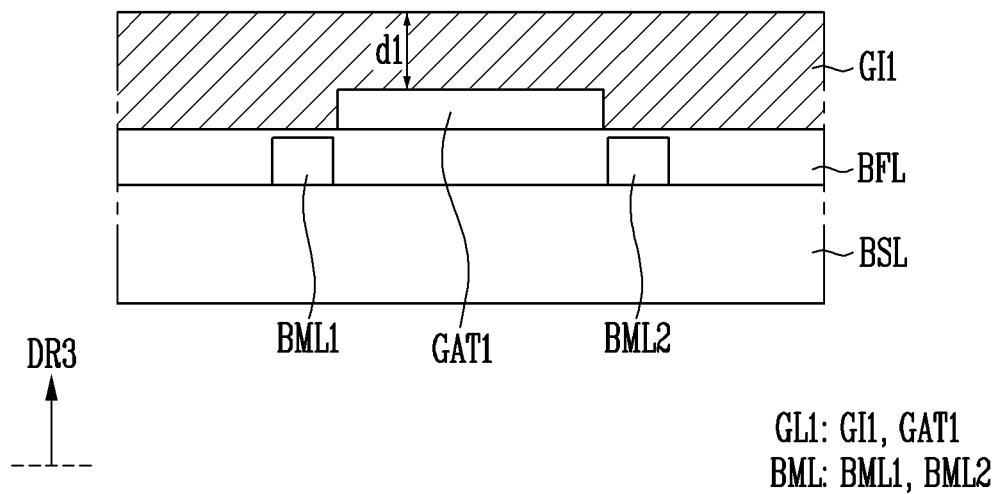
Figure 16:
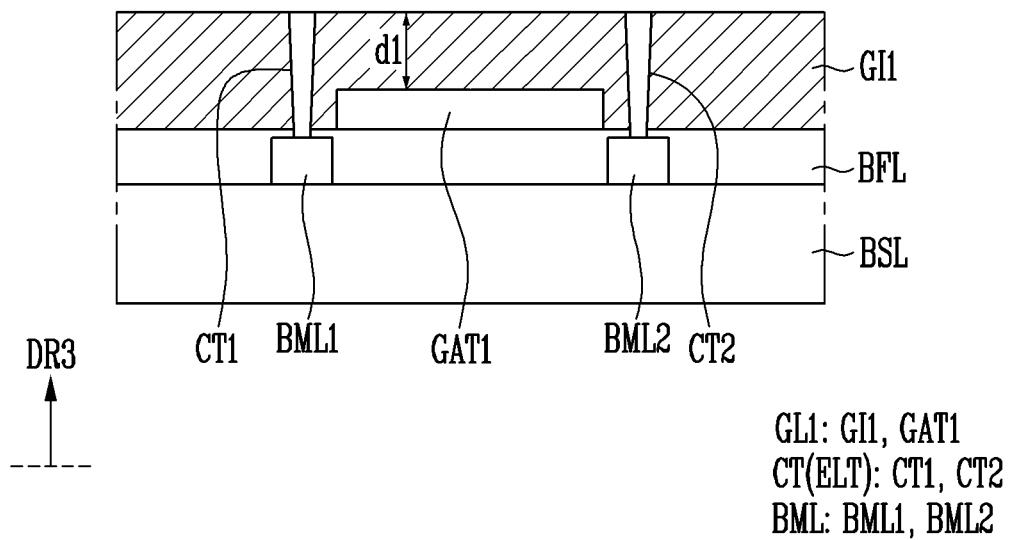
Figure 17:
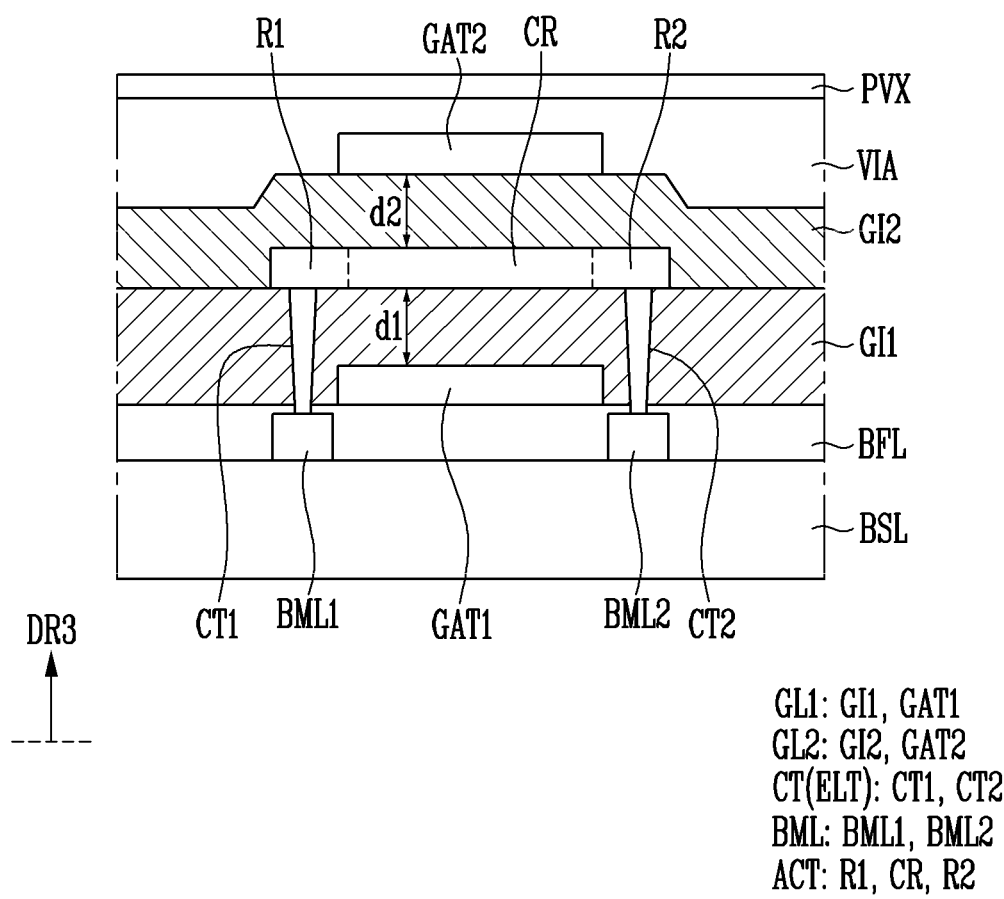

FIG. 8 is a schematic flowchart illustrating a method of manufacturing the display device in accordance with an embodiment of the disclosure. FIGS. 9 to 12 are schematic cross-sectional views illustrating process steps of the method of manufacturing the display device in accordance with an embodiment of the disclosure. FIG. 13 is a schematic flowchart illustrating a method of manufacturing the display device in accordance with an embodiment of the disclosure. FIGS. 14 to 17 are schematic cross-sectional views illustrating process steps of the method of manufacturing the display device in accordance with an embodiment of the disclosure.

Hereinafter, a method of manufacturing the display device 10 in accordance with an embodiment of the disclosure will be described with reference to FIGS. 8 to 12. For example, FIGS. 8 to 12 may correspond to the embodiment of FIG. 4.

Referring to FIG. 8, the method of manufacturing the display device 10 in accordance with an embodiment of the disclosure may include step S100 of forming a buffer layer on a base layer, step S200 of forming a first gate electrode layer on the buffer layer, step S300 of forming an active layer on the first gate electrode layer, step S400 of forming a second gate electrode layer on the active layer, and step S500 of forming a first electrode and a second electrode.

The step S100 of the forming of the buffer layer on the base layer may include a step of preparing a base layer BSL for supporting the display device 10.

The base layer BSL may be a growth substrate. For example, the base layer BSL may be a wafer for depositing an insulating layer, a conductive layer, a semiconductor layer, and the like.

A buffer layer BFL may be deposited on the base layer BSL. In the disclosure, the deposition may be performed using a Physical Vapor Deposition (PVD) process (e.g., a sputtering process or the like), a Chemical Vapor Deposition (CVD) process, an Atomic Layer Deposition (ALD), or the like.

The step S200 of the forming of the first gate electrode layer on the buffer layer may include a step of forming a first gate electrode GAT1 and a first gate insulating layer GI1 on the buffer layer BFL. A first gate electrode layer GL1 may include a first gate electrode GAT1 and a first gate insulating layer GI1.

The first gate electrode GAT1 may be deposited on the buffer layer BFL, and a portion of the first gate electrode GAT1 may be etched. A portion of the first gate electrode GAT1 may be etched, and the first gate electrode GAT1 may not overlap at least a portion of the buffer layer BFL in a plan view. In this specification, the term "overlapping" may mean overlapping in a plan view.

The first gate electrode GAT1 may be formed as a single layer, but the disclosure is not limited thereto. In another embodiment, the first gate electrode GAT1 may be formed as a multi-layer in which at least two materials of metals or alloys are stacked.

The first gate insulating layer GI1 may be formed on the first gate electrode GAT1.

The first gate insulating layer GI1 may have a first thickness d1 in a thickness direction of the base layer BSL. The first gate insulating layer GI1 may have a first dielectric constant.

An active layer ACT may be formed on the first gate insulating layer GI1. The step S300 of the forming of the active layer on the first gate electrode layer may include a step of forming a first region R1, a channel region CR, and a second region R2.

The first region R1 and the second region R2 may be electrically connected to the channel region CR, and be formed as a source region to which a source electrode is electrically connected and a drain region to which a drain electrode is electrically connected. For example, the first region R1 may be a source region, and the second region R2 may be a drain region. However, the disclosure is not necessarily limited thereto. In another embodiment, the first region R1 may be a drain region, and the second region R2 may be a source region.

The step S400 of the forming of the second gate electrode layer on the active layer may include a step of forming a second gate insulating layer GI2 and a second gate electrode GAT2. A second gate electrode layer GL2 may include a second gate insulating layer GI2 and a second gate electrode GAT2.

The second gate insulating layer GI2 may be formed on the active layer ACT. The second gate insulating layer GI2 and the first gate insulating layer GI1 may have different dielectric constants.

The second gate insulating layer GI2 may have a second dielectric constant. According to an embodiment, the first dielectric constant may be equal to or greater than about 7, and the second dielectric constant may be less than about 7. According to an embodiment, the first dielectric constant may be less than about 7, and the second dielectric constant may be equal to or greater than about 7.

The second gate insulating layer GI2 may have a second thickness d2 in a thickness direction of the base layer BSL. The second thickness d2 may be equal to the first thickness d1 of the first gate insulating layer G1, but the disclosure is not limited thereto. In another embodiment, the second thickness d2 and the first thickness d1 may be different from each other. In a gate insulating layer GI, a thickness of a gate insulating layer GI1 or GI2 having a relatively large dielectric constant may be less than a thickness of a gate insulating layer GI2 or GI1 having a relatively small dielectric constant in a thickness direction of the base layer BSL. The second gate electrode GAT2 may be deposited on the second gate insulating layer GI2, and at least a portion of the second gate electrode GAT2 may be etched.

After the second gate electrode layer GL2 is formed, a via layer VIA may be formed. The via layer VIA may be formed on the second gate insulating layer GI2, and planarize the second gate insulating layer GI2. The via layer VIA may be formed between the step S300 of the forming of the active layer on the first gate electrode layer and the step S400 of the forming of the second gate electrode layer on the active layer.

A protective layer PVX may be formed on the via layer VIA. The protective layer PVX may planarize the via layer VIA.

The protective layer PVX may be formed between the step S300 of the forming of the active layer on the first gate electrode layer and the step S400 of the forming of the second gate electrode layer on the active layer. The process of forming the protective layer PVX may be performed after the process of forming the via layer VIA. However, the disclosure is not limited thereto, and according to an embodiment, in case that the via layer VIA is not formed, the protective layer PVX may be formed directly on the second gate electrode GAT2.

In the step S500 of the forming of the first electrode and the second electrode, an electrode ELT may be formed. The electrode ELT may be formed on the protective layer PVX. In the step S500 of the forming of the first electrode and the second electrode, a first electrode ELT1 may be formed to be electrically connected to the first region R1. A second electrode ELT2 may be formed to be electrically connected to the second region R2.

The first electrode ELT1 may be electrically connected to the first region R1, and serve as a source electrode or a drain electrode. The first electrode ELT1 may be electrically connected to some lines in a subsequent process, and serve as an electrical path through which an anode signal or a cathode signal is supplied. The first electrode ELT1 may be electrically connected to some lines in a subsequent process, and form a line of the pixel circuit PXC.

The second electrode ELT2 may be electrically connected to the second region R2, and serve as a source electrode or a drain electrode. The second electrode ELT2 may be electrically connected to some lines in a subsequent process, and serve as an anode electrode or a cathode electrode. The second electrode ELT2 may be electrically connected to some lines in a subsequent process, and form a line of the pixel circuit PXC.

Hereinafter, a method of manufacturing the display device 10 in accordance with an embodiment of the disclosure will be described with reference to FIGS. 13 to 17. The method of manufacturing the display device 10 in FIGS. 13 to 17 may be different from the method of manufacturing the display device 10 in FIGS. 8 to 12, in that a time at which source and drain electrodes are formed are different from each other. Hereinafter, in FIGS. 13 to 17, portions different from those of the embodiment of FIGS. 8 to 12 will be described.

Referring to FIG. 13, the method of manufacturing the display device 10 in accordance with an embodiment of the disclosure may include step S150 of forming an auxiliary electrode layer and a buffer layer on a base layer, step S200 of forming a first gate electrode layer on the buffer layer, step S250 of forming a first contact part and a second contact part, step S300 of forming an active layer on the first gate electrode layer, and step S400 of forming a second gate electrode layer on the active layer.

An auxiliary electrode layer BML may be deposited on a base layer BSL, and at least a portion of the auxiliary electrode layer BML may be etched. The auxiliary electrode layer BML may be formed to be electrically connected to some lines of the pixel circuit PXC. The first auxiliary electrode layer BML1 and the second auxiliary electrode layer BML2 may be formed to be electrically connected to some lines of the pixel circuit PXC.

A contact part CT may be formed after a first gate electrode layer GL1 is formed. The contact part CT may correspond to the electrode ELT of FIG. 4. However, a position of the contact part CT in the display device 10 and the position of the electrode ELT may be different from each other in the display device 10, and the contact part CT and the electrode ELT are described focusing on the differences.

The contact part CT may penetrate a buffer layer and at least a portion of a first gate insulating layer GI1. The contact part CT may be formed to be electrically connected to the auxiliary electrode layer BML. A first contact part CT1 and a second contact part CT2 may be formed to be electrically connected respectively to the first auxiliary electrode layer BML1 and the second auxiliary electrode layer BML2. The contact part CT may electrically connect the auxiliary electrode layer BML and an active layer ACT to each other.

The first contact part CT1 may be formed to be electrically connected to a first region R1. The second contact part CT2 may be formed to be electrically connected to a second region R2. A heat treatment process may be a process of electrically connecting the contact part CT to the first region R1 and the second region R2. The heat treatment process may improve an electrical characteristic, electrons flowing via the switching transistor Ts may be freely moved by the heat treatment process.

After the contact part CT is formed, a second gate electrode layer GL2 may be formed. As a second gate electrode GAT2 is formed after the contact part is formed, the heat treatment process may be performed before the second gate electrode layer GL2 is formed, and an element characteristic change of the second gate electrode GAT2 according to heat treatment can be prevented.

In accordance with the disclosure, a display device 10, a method of manufacturing a display device 10, and a driving method of a display device 10, which can improve a reliability of a driving signal and improve display quality is provided.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a first layer disposed on a base layer and including a first gate electrode, a first gate insulating layer, and an active layer; and
a second layer disposed on the first layer and including a second gate electrode, a second gate insulating layer, and the active layer, wherein
the first layer and the second layer share the active layer,
the first gate insulating layer has a first dielectric constant,
the second gate insulating layer has a second dielectric constant, and
the first dielectric constant and the second dielectric constant are different from each other.

2. The display device of claim 1, wherein
one of the first dielectric constant and the second dielectric constant is equal to or greater than about 7, and
another one of the first dielectric constant and the second dielectric constant is less than about 7.

3. The display device of claim 2, wherein
the first gate insulating layer and the second gate insulating layer include different materials from each other,
one of the first gate insulating layer and the second gate insulating layer includes at least one of zirconium oxide ($Zr_xO_y$), hafnium oxide ($Hf_xO_y$), yttrium oxide ($Y_xO_y$), strontium oxide ($Sr_xO_y$), lanthanum oxide ($La_2O_3$), barium oxide ($Ba_xO_y$), tantalum oxide ($Ta_xO_y$), and titanium oxide ($Ti_xO_y$), and
another one of the first gate insulating layer and the second gate insulating layer includes at least one of silicon oxide ($SiO_x$), silicon nitride ($SiN_x$), and silicon oxynitride ($SiO_xN_y$).

4. The display device of claim 2, further comprising:
an electrode including a first electrode and a second electrode and disposed on the second gate insulating layer,
wherein the electrode is electrically connected to the active layer by penetrating the second gate insulating layer.

5. The display device of claim 2, further comprising:
an auxiliary electrode layer disposed on the base layer; and
a contact part penetrating the first gate insulating layer,
wherein the auxiliary electrode layer is electrically connected to the active layer through the contact part.

6. The display device of claim 2, wherein
the first gate insulating layer has a first thickness in a thickness direction of the base layer,
the second gate insulating layer has a second thickness in the thickness direction, and
the first thickness and the second thickness are same.

7. The display device of claim 2, wherein
the first gate insulating layer has a first thickness in a thickness direction of the base layer,
the second gate insulating layer has a second thickness in the thickness direction, and
the first thickness and the second thickness are different from each other.

8. The display device of claim 1,
further comprising:
a pixel circuit formed on the base layer and including a driving transistor and a switching transistor; and
a light emitting element electrically connected to the pixel circuit, wherein
the switching transistor includes the active layer, the first gate electrode, and the second gate electrode.

9. The display device of claim 1, further comprising:
a pixel circuit formed on the base layer and including a driving transistor and a switching transistor; and
a light emitting element electrically connected to the pixel circuit, wherein
the switching transistor includes the active layer, the first gate electrode, and the second gate electrode,
the switching transistor is operated in one of a first driving mode and a second driving mode,
in the first driving mode, the switching transistor is operated by supplying a first gate signal to the first gate electrode, and
in the second driving mode, the switching transistor is operated by supplying a second gate signal to the second gate electrode.

10. The display device of claim 9, wherein
the first dielectric constant is greater than the second dielectric constant,
the switching transistor is operated in the first driving mode in case that one of the first gate signal and the second gate signal having a first driving frequency equal to or greater than a predetermined frequency is applied to the switching transistor, and
the switching transistor is operated in the second driving mode in case that another one of the first gate signal and the second gate signal having a second driving frequency less than the predetermined frequency is applied to the switching transistor.

11. The display device of claim 9, wherein
the first dielectric constant is less than the second dielectric constant,
the switching transistor is operated in the first driving mode in case that one of the first gate signal and the second gate signal having a first driving frequency less than a predetermined frequency is applied to the switching transistor, and
the switching transistor is operated in the second driving mode in case that another one of the first gate signal and the second gate signal having a second driving frequency equal to or greater than the predetermined frequency is applied to the switching transistor.

12. The display device of claim 10, wherein, in case that the switching transistor is operated in the first driving mode,
the first gate signal is applied to the first gate electrode, and
the second gate signal is not applied to the second gate electrode.

13. The display device of claim 11, wherein the predetermined frequency is about 60 Hz.

14. A method of manufacturing a display device, the method comprising:
forming a first gate electrode and a first gate insulating layer on a base layer;
forming an active layer on the first gate insulating layer; and
forming a second gate insulating layer and a second gate electrode on the active layer, wherein
the first gate insulating layer has a first dielectric constant,
the second gate insulating layer has a second dielectric constant,
one of the first dielectric constant and the second dielectric constant is equal to or greater than to about 7, and
another one of the first dielectric constant and the second dielectric constant is less than about 7.

15. The method of claim 14, further comprising:
forming a first electrode and a second electrode on the second gate insulating layer,
wherein the first electrode and the second electrode are electrically connected to the active layer by penetrating the second gate insulating layer.

16. The method of claim 14, further comprising:
forming an auxiliary electrode layer on the base layer; and
forming a first electrode and a second electrode penetrating the first gate insulating layer, wherein
the first electrode and the second electrode are electrically connected to the active layer by penetrating the first gate insulating layer, and
the forming of the first electrode and the second electrode includes performing a heat treatment process.

17. The method of claim 14, further comprising:
providing a pixel circuit formed on the base layer and including a driving transistor and a switching transistor; and
providing a light emitting element electrically connected to the pixel circuit, wherein
the switching transistor includes the active layer, the first gate electrode, and the second gate electrode.

18. A method of driving a display device, wherein
the display device includes:
a driving transistor and a switching transistor on a base layer, the switching transistor includes:
a first layer disposed on the base layer and including a first gate electrode, a first gate insulating layer, and an active layer; and
a second layer disposed on the first layer and including a second gate electrode, a second gate insulating layer, and the active layer,
the first layer and the second layer share the active layer,
the first gate insulating layer has a first dielectric constant,
the second gate insulating layer has a second dielectric constant, and
the first dielectric constant and the second dielectric constant are different from each other,
wherein the method includes a first driving mode and a second driving mode,
in the first driving mode, the switching transistor is operated based on a first gate signal supplied to the first gate electrode, and
in the second driving mode, the switching transistor is operated based on a second gate signal supplied to the second gate electrode.

19. The method of claim 18, wherein
the first dielectric constant is greater than the second dielectric constant,
in the first driving mode, the switching transistor is operated in case that one of the first gate signal and the second gate signal having a first driving frequency equal to or greater than a predetermined frequency is applied to the switching transistor, and
in the second driving mode, the switching transistor is operated in case that another one of the first gate signal and the second gate signal having a second driving frequency less than the predetermined frequency is applied to the switching transistor.

20. The method of claim 18, wherein
the first dielectric constant is less than the second dielectric constant,
in the first driving mode, the switching transistor is operated in case that one of the first gate signal and the second gate signal having a first driving frequency less than a predetermined frequency is applied to the switching transistor, and
in the second driving mode, the switching transistor is operated in case that another one of the first gate signal and the second gate signal having a second driving frequency equal to or greater than the predetermined frequency is applied to the switching transistor.

* * * * *